(12) United States Patent
Siddiqui et al.

(10) Patent No.: US 12,043,908 B1
(45) Date of Patent: *Jul. 23, 2024

(54) ELECTROCHEMICAL CELL WITH NANOPARTICLE ELECTRODE

(71) Applicant: KING FAHD UNIVERSITY OF PETROLEUM AND MINERALS, Dhahran (SA)

(72) Inventors: Mohammad Nahid Siddiqui, Dhahran (SA); Mohammad Qamar, Dhahran (SA); Alaaldin Mohamed Abdalla Adam, Dhahran (SA); Munzir H. Suliman, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 18/603,287

(22) Filed: Mar. 13, 2024

Related U.S. Application Data

(63) Continuation of application No. 16/518,319, filed on Jul. 22, 2019, now Pat. No. 11,982,006.

(51) Int. Cl.
*C25B 11/091* (2021.01)
*C25B 1/04* (2021.01)

(52) U.S. Cl.
CPC .............. *C25B 11/091* (2021.01); *C25B 1/04* (2013.01)

(58) Field of Classification Search
CPC ....... C25B 1/04; C25B 11/091; C25B 11/054; C25B 11/065; C25B 11/052; C25B 11/051
See application file for complete search history.

(56) References Cited

U.S. PATENT DOCUMENTS

| | | |
|---|---|---|
| 2009/0011204 A1 | 1/2009 | Wang |
| 2009/0081501 A1 | 3/2009 | Vu |
| 2017/0015558 A1 | 1/2017 | Zhang |

FOREIGN PATENT DOCUMENTS

| | | |
|---|---|---|
| CN | 10-2009-0062704 A | 6/2009 |
| CN | 107362818 A | 11/2017 |
| CN | 108722453 A | 11/2018 |
| CN | 107937967 A | 4/2019 |
| WO | WO 01/23501 A1 | 4/2001 |

OTHER PUBLICATIONS

Huang et al. Ultrasmall diiron phosphide nanodots anchored on graphene sheets with enhanced electrocatalytic activity for hydrogen production via high-efficiency water splitting, J. Mater. Chem. A, 2016,4, 16028-16035 (Year: 2016).*

(Continued)

*Primary Examiner* — Luan V Van
*Assistant Examiner* — Mofoluwaso S Jebutu
(74) *Attorney, Agent, or Firm* — Oblon, McClelland, Maier & Neustadt, L.L.P.

(57) ABSTRACT

A noble metal free nanocomposite of a transition metal phosphide catalyst supported on ultrathin interconnected carbon nanosheets and its use as an efficient low cost electrocatalyst are disclosed. An electrochemical cell comprising a working electrode coated with the electrocatalyst for the production of hydrogen by electrolysis of water.

15 Claims, 32 Drawing Sheets

(56) References Cited

OTHER PUBLICATIONS

Zehua Cui, et al., "Ionic Liquids-Based Iron Phosphide/Carbon Nanotubes Composites: High Active Electrocatalysts towards Hydrogen Evolution Reaction", ChemistrySelect, vol. 2, Issue 3, Jan. 25, 2017, pp. 1019-1024 (Abstract only).

Tianhao L, et al., "A high active hydrogen evolution reaction electrocatalyst from ionic liquids-originated cobalt phosphide/carbon nanotubes", International Journal of Hydrogen Energy, vol. 42, Issue 34, Aug. 24, 2017, pp. 21786-21792 (Abstract only).

Munzir H. Suliman, et al., "Facile synthesis of ultrathin interconnected carbon nanosheets as a robust support for small and uniformly-dispersed iron phosphide for the hydrogen evolution reaction", Carbon, vol. 144, Apr. 2019, pp. 764-771 (Abstract only).

Libin Yang, et al., "Cobalt phosphide nanowall arrays supported on carbon cloth: an efficient monolithic non-noble-metal hydrogen evolution catalyst", NanoTechnology, vol. 27, No. 47, Nov. 25, 2016, p. 475702 (Abstract only).

Alaaldin Adam, et al., "Rationally Dispersed Molybdenum Phosphide on Carbon Nanotubes for the Hydrogen Evolution Reaction", ACS Sustainable Chemistry & Engineering, vol. 6, 2018, pp. 11414-11423.

Alaaldin Adam, et al., "Interconnected Hollow Cobalt Phosphide Grown on Carbon Nanotubes for Hydrogen Evolution Reaction", ACS Applied Materials & Interfaces, vol. 10, 2018, pp. 29407-29416.

Z. H. Ni, H. M. Wang, J. Kasim, H. M. Fan, T. Yu, Y. H. Wu, Y. P. Feng, and Z. X. Shen, Graphene Thickness Determination Using Reflection and Contrast Spectroscopy, Nano Letters 2007 7 (9), 2758-2763 (Year: 2007).

Ruizhong Zhang, Chunmei Zhang and Wei Chen, FeP embedded in N, P dual-doped porous carbon nanosheets: an efficient and durable bifunctional catalyst for oxygen reduction and evolution reactions, J. Mater. Chem. A, 2016,4, 18723-18729 (Year: 2016).

Juan F. Callejas et al., Electrocatalytic and Photocatalytic Hydrogen Production from Acidic and Neutral-pH Aqueous Solutions Using Iron Phosphide Nanoparticles, ACS Nano 2014 8 (11), 11101-11107 (Year: 2014).

Yan Zhang, Huijuan Zhang, Yangyang Feng, Li Liu, and Yu Wang, Unique Fe2P Nanoparticles Enveloped in Sandwichlike Graphited Carbon Sheets as Excellent Hydrogen Evolution Reaction Catalyst and Lithium-Ion Battery Anode, ACS Applied Materials & Interfaces 2015 7 (48), 26684-26690 (Year: 2015).

Yang Yu et al., FeP Nanocrystals Embedded in N-Doped Carbon Nanosheets for Efficient Electrocatalytic Hydrogen Generation over a Broad pH Range, ACS Sustainable Chemistry & Engineering 2018 6 (9), 11587-11594 (Year: 2018).

Lidong Chen, Shuhao Yang, Jianyu Huang, Wanqiu Xie, Baichuan Ding, Yingliang Liu, Fei Xu, Yeru Liang, Two-dimensional porous carbon nanosheets from exfoliated nanopaper-like biomass, Materials Letters, vol. 232, 2018, pp. 187-190 (Year: 2018).

Huailin Fan, Huan Liu, Xun Hu, Guangqiang Lv, Yan Zheng, Fei He, Delong Ma, Qing Liu, Yizhong Lu and Wenzhong Shen, Fe2P@mesoporous carbon nanosheets synthesized via an organic template method as a cathode electrocatalyst for Zn-air batteries, J. Mater. Chem. A, Apr. 3, 2019.7, 11321-11330 (Year: 2019).

Zhichao Gao, Qian Gao, Zhipeng Liu, Cong Zhang, Xiaoting Zhang, Xin Liu, Runwei Wang and Nan Li, High-efficiency hydrogen evolution reaction catalyzed by iron phosphide nanocrystals, RSC Adv., 2016, 6, 114430 (Year: 2016).

Zhipeng Huang. Cuncai Lv, Zhongzhong Chen, Zhibo Chen, Feng Tian, Chi Zhang, One-pot synthesis of diiron phosphide/nitrogen-doped graphene nanocomposite for effective hydrogen generation, Nano Energy, vol. 12, 2015, pp. 666-674 (Year: 2015).

Shaojun Liu et al., Carbon nanotubes intercalated Co/N-doped porous carbon nanosheets as efficient electrocatalyst for oxygen reduction reaction and zinc-air batteries, Chemical Engineering Journal, vol. 342, 2018, pp. 163-170 (Year: 2018).

Yang Yu et al., Supporting Information: FeP Nanocrystals Embedded in N-Doped Carbon Nanosheets for Efficient Electrocatalytic Hydrogen Generation over a Broad pH Range, ACS Sustainable Chemistry & Engineering 2018 6 (9), 11587-11594 (Year: 201).

* cited by examiner

ELECTROCHEMICAL CELL WITH NANOPARTICLE ELECTRODE

CROSS-REFERENCE TO RELATED APPLICATIONS

The present application is a Continuation of U.S. application Ser. No. 16/518,319, now allowed, having a filing date of Jul. 22, 2019.

STATEMENT OF ACKNOWLEDGEMENT

Inventors acknowledge the support of the Center of Excellence in Nanotechnology through NT-2018-MQ at King Fahd University of Petroleum and Minerals (KFUPM).

STATEMENT REGARDING PRIOR DISCLOSURES BY THE INVENTOR

Aspects of this technology were described by Suliman, M. H., Adam, A., Siddiqui, M. N., Yamani, Z. H., and Qamar, M. Carbon Vol. 144, (April 2019) 764-771, available on line Jan. 4, 2019 and which is incorporated by reference for all purposes.

BACKGROUND OF THE INVENTION

Field of the Invention

The present invention relates to an electrocatalyst comprising a transition metal phosphide supported on interconnected thin carbon nanosheets, an electrode coated with the electrocatalyst, and a method for the production of hydrogen from water using the electrode.

Description of Related Art

The "background" description provided herein is for the purpose of generally presenting the context of the disclosure. All references cited herein are incorporated by reference. Work of the presently named inventors, to the extent it is described in this background section, as well as aspects of the description which may not otherwise qualify as prior art at the time of filing, are neither expressly or impliedly admitted as prior art against the present disclosure.

Global energy demand and adverse climate change are driving scientists to explore sustainable and eco-friendly sources of energy. Among energy carriers, hydrogen gas shows a great promise due to having the highest gravimetric energy density and forming only environmentally benign byproducts, i.e., water [Whitesides et al. "Don't forget long-term fundamental research in energy" Science (2007) 315, 796-798]. Currently, hydrogen is produced in large scale through the steam-methane reforming process ($CH_4 + H_2 \rightleftharpoons CO + H_2$). The process has high energy demand, consumes fossil fuel and, more importantly, produces carbon dioxide as a byproduct, a greenhouse gas. Replacing fossil fuels with a clean energy source such as hydrogen remains a goal at the forefront of current and future fuels research and development.

Electrolysis of water has a great potential for large scale production of hydrogen without production of undesired greenhouse gases [Wang et al. "Non-noble metal-based carbon composites in hydrogen evolution reaction: fundamentals to applications" Adv. Mater. 29 (2017) 1605838-1605875; Vesborg et al. "Recent development in hydrogen evolution reaction catalysts and their practical implementation" J. Phys. Chem. Lett. 6 (2015) 951-957; Faber et al. "Earth-abundant inorganic electrocatalysts and their nanostructures for energy conversion applications" Energy Environ. Sci. 7 (2014) 3519-3542; and Zouc et al. "Noble metal-free hydrogen evolution catalysts for water splitting" Chem. Soc. Rev. 44 (2015) 5148-5180. The electrolysis method requires high electric potential to split water, which remains a major obstacle to overcome. Currently, major efforts are underway to address this technological challenge by designing and developing low-cost, stable electrocatalysts that are able to lower the electric potential of electrolysis of water and hence, lower the cost of hydrogen production. As a result, a wide variety of materials comprising non-precious metals, such as carbides, sulfides, nitrides, phosphides, and borides, of transition metals, have been explored as catalysts for this purpose [Michalsky et al. "Trends in the hydrogen evolution activity of metal carbide catalysts" ACS Catal. 4 (2014) 1274-1278; Huang et al. "$Mo_2C$ Nanoparticles dispersed on hierarchical carbon microflowers for efficient electrocatalytic hydrogen evolution" ACS Nano 10 (2016) 11337-11343; Fan et al. $M_3C$ (M: Fe, Co, Ni) Nanocrystals encased in graphene nanoribbons: an active and stable bifunctional electrocatalyst for oxygen reduction and hydrogen evolution reactions, ACS Nano 9 (2015) 5125-5134; Qamar et al. "Metal-organic framework-guided growth of $Mo_2C$ embedded in mesoporous carbon as a high performance and stable electrocatalyst for the hydrogen evolution reaction" J. Mater. Chem. A 4 (2016) 16225-16232; Li et al. "Molybdenum sulfide/N-doped CNT forest hybrid catalysts for high-performance hydrogen evolution reaction" Nano Lett. 14 (2014) 1228-1233; Morales-Guio et al. "Nanostructured hydrotreating catalysts for electrochemical hydrogen evolution" Chem. Soc. Rev. 43 (2014) 6555-6569; Voiry et al. "Enhanced catalytic activity in strained chemically exfoliated $WS_2$ nanosheets for hydrogen evolution" Nat. Mater. 12 (2013) 850-855; Kong et al. "$CoSe_2$ nanoparticles grown on carbon fiber paper: an efficient and stable electrocatalyst for hydrogen evolution reaction" J. Am. Chem. Soc. 136 (2014) 4897-4900; Cao et al. "Mixed close-packed cobalt molybdenum nitrides as non-noble metal electrocatalysts for the hydrogen evolution reaction" J. Am. Chem. Soc. 135 (2013) 19186-19192; Chen et al. "Hydrogen-evolution catalysts based on non-noble metal nickel-molybdenum nitride nanosheets" Angew. Chem. Int. Ed. 51 (2012) 6131-6135; Shi et al. "Recent advances in transition metal phosphide nanomaterials: synthesis and applications in hydrogen evolution reaction" Chem. Soc. Rev. 45 (2016) 1529-1541; Callejas et al. "Synthesis, characterization, and properties of metal phosphide catalysts for the hydrogen-evolution reaction" Chem. Mater. 28 (2016) 6017-6044; Xu et al. "Anion-exchange synthesis of nanoporous FeP nanosheets as electrocatalysts for hydrogen evolution reaction" Chem. Commun. 49 (2013) 6656-6658; Adam et al. "Interconnected hollow cobalt phosphide grown on carbon nanotubes for hydrogen evolution reaction" ACS Appl. Mater. Interfaces 10 (2018) 29407-29416; Adam et al. "Rationally dispersed molybdenum phosphide on carbon nanotubes for the hydrogen evolution reaction" ACS Sustainable Chem. Eng. 6 (2018) 11414-11423; Chen et al. "Highly active, nonprecious electrocatalyst comprising borophene subunits for the hydrogen evolution reaction" J. Am. Chem. Soc. 139 (2017) 12370-12373; and Jothi et al. "Molybdenum diboride nanoparticles as a highly efficient electrocatalyst for the hydrogen evolution reaction" Sustainable Energy Fuels 1 (2017) 1928-1934]. The activation potential is determined by catalyst composition, and could be significantly reduced by careful selection of the elements of the electrocatalyst. Phosphides of transition metals are viewed as potential alternatives to Pt-based electrocatalysts due to their low-cost, high activity, and stability under electrolysis conditions (Shi et al. and Callejas et al.). Iron phosphides have been investigated as potential electrocatalyst for hydrogen evolution reaction (HER) because of their low cost and high activity [Read et al. "General strategy for the synthesis of transition metal phosphide films for electrocatalytic hydrogen and oxygen evolution" ACS Appl. Mater. Interfaces 8 (2016) 12798-12803; Jiang et al. "Synthesis of $FeP_2$/C nanohybrids and their performance for hydrogen evolution reaction" J. Mater. Chem. A 3 (2015) 499-503; Xu et al. "Anion-exchange synthesis of nanoporous FeP nanosheets as electrocatalysts for hydrogen evolution reaction" Chem. Commun. 49 (2013) 6656-6658; Tian et al. "Electrochemical activity of iron phosphide nanoparticles in hydrogen evolution reaction" ACS Catal. 6 (2016) 5441-5448; Zhang et al. "Unique $Fe_2P$ nanoparticles enveloped in sandwich-like graphited carbon sheets as excellent hydrogen evolution reaction catalyst and lithium-ion battery anode" ACS Appl. Mater. Interfaces 7 (2015A) 26684-26690; Liu et al. "Nitrogen-doped carbon nanotube supported iron phosphide nanocomposites for highly active electrocatalysis of the hydrogen evolution reaction" Electrochim. Acta 149 (2014) 324-329; Lv et al. "Phosphorus doped single wall carbon nanotubes loaded with nanoparticles of iron phosphide and iron carbide for efficient hydrogen evolution" J. Mater. Chem., A 4 (2016) 13336-13343; Zhang et al. "FeP Nanoparticles grown on graphene sheets as highly active non-precious-metal electrocatalysts for hydrogen evolution reaction" Chem. Commun. 50 (2014) 11554-11557; Zhang et al. "Modifying candle soot with FeP nanoparticles into high-performance and cost-effective catalysts for the electrocatalytic hydrogen evolution reaction" Nanoscale 7 (2015B) 4400-4405; and Chung et al. "Large-scale synthesis of carbon-shell-coated FeP nanoparticles for robust hydrogen evolution reaction electrocatalyst" J. Am. Chem. Soc., 139 (2017) 6669-6674]. In supported catalytic systems, the performance of an electrode is predominantly dictated by the support and the active sites of the catalyst. Coupling an active surface and a support induces metal-support-interactions leading to enhanced electrocatalytic activity and improvement in critical electrode processes such as the interfacial equilibrium, adsorption and/or desorption of reactive species and their interaction with the electrocatalyst surface, and electrical conductivity. As a result, FeP has been dispersed on different carbon-based supports and its electrocatalytic performance for HER was investigated. For instance, Liu et al. supported iron phosphide on nitrogen-doped carbon nanotube and investigated the HER performance. Similarly, phosphorous doped single wall carbon nanotubes were used as a support for iron phosphide nanoparticles for HER in acidic and basic solutions. In another study, FeP nanoparticles were grown on graphene sheets and evaluated as non-precious-metal electrocatalysts for HER. Tang and coworkers employed candle soot as support for FeP nanoparticles, and demonstrated efficient HER in acidic electrolyte. Recently, scalable synthesis of carbon-shell-coated FeP nanoparticles was demonstrated for robust HER.

CN107937967A discloses multi-channel transition metal phosphide carbon nanotube as a catalyst for the electrochemical production of hydrogen and a method of making the catalyst. The method of making the catalyst comprises preparing a mixture of carbon nanotubes and a transition metal complex and heating the mixture in the presence of phosphoric acid or sodium hypophosphite at a temperature of at least 300° C. to produce the electrocatalyst. A pretreated glassy carbon electrode is treated with a suspension of the electrocatalyst and triphenylphosphine or derivatives thereof. The treated glassy electrode is air dried and then placed in a boric acid solution comprising phosphate and a transition metal salt at a pH in the range 0 to 13. The electrode is electroplated by scanning between −2.0 to 2.0 mV followed by scraping the catalyst from the surface of the electrode. The disclosed transition metal salts include iron salts.

CN107362818A discloses nitrogen-phosphorus double-doped carbon coated transition metal diphosphide as a catalyst for the production of hydrogen. The chemical composition of the catalyst of CN107362818A contains nitrogen-phosphorus double-doped carbon.

CN108722453A discloses molybdenum phosphide nanowires coated with carbon layer as a catalyst for the electrochemical production of hydrogen from alkaline solution. The catalyst of CN108722453A contains molybdenum phosphide.

KR2009062704A discloses a transition metal-carbon nitride nanotube composite as a catalyst for the electrochemical production of hydrogen from a sodium borohydride solution. The KR2009062704A catalyst contains a metal nitride component.

WO2001023501A1 discloses a transition metal phosphide catalyst dispersed on a high surface area support. Examples of the transition metals and the high surface area supports include iron oxide and carbon, respectively.

Cui et al. [Chemistry Select (2017) 2 (3): doi.org/10.1002/slct.201601542] disclose iron phosphide supported on carbon nanotubes prepared by a method comprising mixing N,N-bis(4-methyoxycarbonyl)benzyl)-N-methyl-d-glucanium bromide (MBMG-Br) and $FeCl_3$ to form an ionic liquid. Carbon nanotubes (CNT) and sodium hypophosphite are mixed with the ionic liquid and the mixture is heated to 300° C. The resulting FePMBMG/CNT exhibited electro catalytic activity toward the evolution of hydrogen from aqueous acidic solution.

Li et al. [Inter. J. Hydrogen Energy (2017) 42 (34) 21786-21792] disclose the electrochemical catalyst COPMBMG/CNT for electrochemical production of hydrogen from an aqueous solution. The catalyst appears to be prepared as described above by Cui et al. by replacing $FeCl_3$ with $CoCl_2Br_2$. The Li catalyst contains cobalt.

Yang et al. [Nanotechnology (2016) 27(47) 475702] disclose a cobalt phosphide nanowall array supported on carbon cloth as an effective catalyst for the hydrolytic dehydrogenation of sodium borohydride and alkaline hydrogen evolution.

None of the above mentioned catalyst or methods provides an electrocatalyst that is capable of reliably carrying out the HER reaction. It is therefore one object of the disclosure is to provide ultrathin and interconnected carbon nanosheets as a robust solid support for dispersion of transition phosphide nanoparticles as an efficient electrocatalyst for the production of hydrogen from water by electrolysis.

The foregoing paragraphs have been provided by way of general introduction, and are not intended to limit the scope of the following claims. The described embodiments, together with further advantages, will be best understood by reference to the following detailed description taken in conjunction with the accompanying drawings.

SUMMARY OF THE INVENTION

One aspect of the invention is directed to an electrocatalyst comprising nanoparticles of transition metal phosphide, and a catalyst support comprising carbon nanosheets, wherein the nanoparticles have an average diameter in the range of 1 nm to 30 nm, and the carbon nanosheets have thickness of less than 10 nm.

In a preferred embodiment, the transition metal is selected from the group consisting of nickel, cobalt, iron, titanium, vanadium, chromium, copper, zinc, molybdenum, and tungsten.

In a more preferred embodiment, the transition metal phosphide is iron.

In another preferred embodiment, the nanoparticles are homogenous spherical nanoparticles having a dimeter in the range of 2 nm to 20 nm.

In another preferred embodiment, the carbon nanosheets are interconnected.

In another preferred embodiment, the thickness of the nanosheets is less than 5 nm.

In another preferred embodiment, the molar ratio of metal phosphide to carbon nanosheets is in the range 0.05-0.5.

In a more preferred embodiment, the molar ratio of the metal phosphide to carbon nanosheets is in the range of 0.08-0.30.

In another preferred embodiment, the catalyst comprising iron phosphide nanoparticles having an average diameter in the range of 2 nm to 20 nm supported on carbon nanosheets having thickness of less than 5 nm, wherein the molar ratio of the metal phosphide to carbon nanosheets is in the range of 0.08-0.30.

Another aspect of the invention is directed to a method of making an electrocatalyst comprises:
preparing carbon nanosheets by heating sodium salt of a carboxylic acid at a temperature in the range of 600-1200° C. under inert gas;
adding the nanosheets to a solution of a transition metal salt in an alcohol to form suspension, stirring the suspension for 2-10 hours;
removing the alcohol to produce a powder;
placing the powder and sodium hypophosphite ($NaPO_2H_2$) in a weight ratio of 1:80 in two separate crucibles;
heating the crucibles under a flow of inert gas at a temperature in the range of 200-600° C. for 0.5 to 4.0 hours, wherein the crucible containing the sodium hypophosphite is placed up stream relative to that of the powder.

In a preferred embodiment of the method, the transition metal salt is at least one transition metal selected from the group consisting of nickel, cobalt, iron, titanium, vanadium, chromium, copper, zinc, molybdenum, and tungsten.

In a more preferred embodiment of the method, the metal salt is $FeCl_2$.

In another preferred embodiment, the weight ratio of the powder to the sodium hypophosphite is 1:20.

In another preferred embodiment, the heating temperature is in the range of 500° C. to 600° C.

In a more preferred embodiment, the heating temperature is about 400° C.

In another preferred embodiment, the inert gas is nitrogen or argon.

Another aspect of the invention is directed to modified electrode comprising an electrically conductive substrate coated with the electrocatalyst of the invention.

In a preferred embodiment, the modified electrode has electrocatalyst loading in the range of 0.2-10 $mg/cm^2$ of the surface of the electrode.

In another preferred embodiment, the modified electrode has BET surface area in the range of 100 to 200 $m^2/g$.

In another preferred embodiment, the electrically conductive substrate is selected from the group consisting of selected from the group consisting of glassy carbon, graphite, gold, platinum, silver, iron, copper, and aluminum.

Another aspect of the invention is directed to a method of making the modified electrode of the invention comprises:
prepared a slurry of the catalyst in aqueous ethanol containing tetrafluoroethylene-perfluoro-3,6-dioxa-4-methyl-7-octenesulfonic acid (NAFION®) copolymer in an amount in the range of 0.001 wt. % to 0.01 wt. %, sonicating the slurry to form a suspension, depositing the suspension on the surface of an electrically conductive substrate, and air drying the deposited suspension on the surface of the electrically conductive substrate, and repeating the depositing and drying steps until a electrocatalyst in the range of loading 0.2-10 $mg/cm^2$ is achieved.

In another preferred embodiment, the desired catalyst loading is in the range of 0.5-2 $mg/cm^2$.

In another preferred embodiment, the electrically conductive substrate is selected from the group consisting of selected from the group consisting of glassy carbon, graphite, gold, platinum, silver, iron, copper, and aluminum.

Another aspect of the invention is directed to an electrochemical cell comprising the electrode of the invention as a working electrode, a counter electrode, and an electrolyte.

In a preferred embodiment, the electrolyte is an aqueous alkali metal hydroxide or an acid at a concentration in the range of 0.1 to 2.0 M.

In another preferred embodiment, the electrolyte is 0.5 M aqueous sulfuric acid.

Another aspect of the invention is directed to an electrochemical method for producing hydrogen from water comprises:
providing the electrochemical cell of the invention,
applying an electric potential; and forming hydrogen by electrolytically splitting water.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1A:
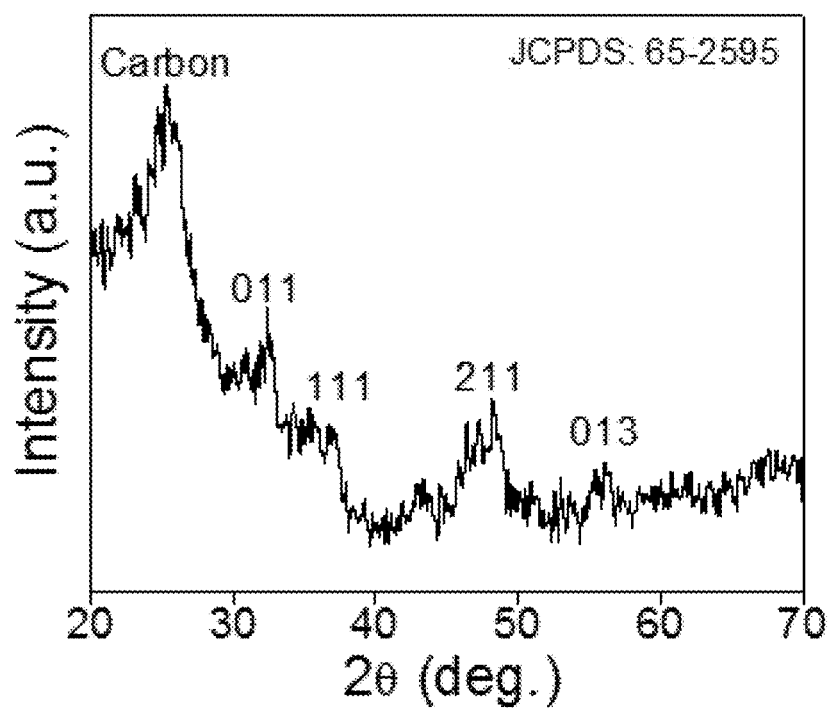
FIG. 1A shows X-ray powder diffraction (XRD) patterns of FeP/CN.

Embodiments of the present disclosure will now be described more fully hereinafter with reference to the accompanying drawings, in which some, but not all embodiments of the disclosure are shown. The present disclosure will be better understood with reference to the following definitions.

All publications mentioned herein are incorporated herein by reference in full for the purpose of describing and disclosing the methodologies, which are described in the publications, which might be used in connection with the description herein. Nothing herein is to be construed as an admission that the inventors are not entitled to antedate such disclosure by virtue of prior disclosure. Also, the use of "or" means "and/or" unless stated otherwise. Similarly, "comprise," "comprises," "comprising" "include," "includes," and "including" are interchangeable and not intended to be limiting.

Unless otherwise specified, "a" or "an" means "one or more".

Terminology used herein is for the purpose of describing particular embodiments only and is not intended to be limiting of the invention.

The headings (such as "Background" and "Summary") and sub-headings used herein are intended only for general organization of topics within the present invention, and are not intended to limit the disclosure of the present invention or any aspect thereof. In particular, subject matter disclosed in the "Background" may include novel technology and may not constitute a recitation of prior art. Subject matter disclosed in the "Summary" is not an exhaustive or complete disclosure of the entire scope of the technology or any embodiments thereof. Classification or discussion of a material within a section of this specification as having a particular utility is made for convenience, and no inference should be drawn that the material must necessarily or solely function in accordance with its classification herein when it is used in any given composition.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

As used herein, the term "and/or" includes any and all combinations of one or more of the associated listed items and may be abbreviated as "/".

Links are disabled by deletion of http: or by insertion of a space or underlined space before www. In some instances, the text available via the link on the "last accessed" date may be incorporated by reference.

As used herein in the specification and claims, including as used in the examples and unless otherwise expressly specified, all numbers may be read as if prefaced by the word "substantially", "about" or "approximately," even if the term does not expressly appear. As used herein, the term "about" refers to an approximate number within 20% of a stated value, preferably within 15% of a stated value, more preferably within 10% of a stated value, and most preferably within 5% of a stated value. For example, if a stated value is about 8.0, the value may vary in the range of 8±1.6, ±1.0, ±0.8, ±0.5, ±0.4, ±0.3, ±0.2, or ±0.1.

Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10 it also describes subranges for Parameter X including 1-9, 1-8, 1-7, 2-9, 2-8, 2-7, 3-9, 3-8, 3-7, 2-8, 3-7, 4-6, or 7-10, 8-10, or 9-10 as mere examples. A range encompasses its endpoints as well as values inside of an endpoint, for example, the range 0-5 includes 0, >0, 1, 2, 3, 4, <5, and 5.

As used herein, the words "preferred" and "preferably" refer to embodiments of the technology that afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the technology.

As referred to herein, all compositional percentages are by weight of the total composition, unless otherwise specified. As used herein, the word "include," and its variants, is intended to be non-limiting, such that recitation of items in a list is not to the exclusion of other like items that may also be useful in the materials, compositions, devices, and methods of this technology. Similarly, the terms "can" and "may" and their variants are intended to be non-limiting, such that recitation that an embodiment can or may comprise certain elements or features does not exclude other embodiments of the present invention that do not contain those elements or features.

The description and specific examples, while indicating embodiments of the technology, are intended for purposes of illustration only and are not intended to limit the scope of the technology. Moreover, recitation of multiple embodiments having stated features is not intended to exclude other embodiments having additional features, or other embodiments incorporating different combinations of the stated features. Specific examples are provided for illustrative purposes of how to make and use the compositions and methods of this technology and, unless explicitly stated otherwise, are not intended to be a representation that given embodiments of this technology have, or have not, been made or tested.

As used herein the terms "electrocatalyst" and "catalyst" are used interchangeably and refer to the catalyst of the invention, i.e., transition metal phosphide supported on interconnected carbon nanotubes (CNT) nanosheets (CNS).

A first aspect of the invention is directed to a noble metal free electrocatalyst comprising transition a metal phosphide nanocrystals having an average diameter in the range of 1 nm to 30 nm, preferably 2-25 nm, preferably 3-20 nm, preferably 4-18 nm, preferably 4-15 nm, or 5-10 nm supported on carbon nanosheets, preferably interconnected, having thickness of less than 10 nm, less than 9 nm, less than 8 nm, less than 7 nm, less than 6 nm, less than 5 nm, less than 4 nm, less than 3 nm, or less than 2 nm.

Any phosphide of a transition metal in block-d of the periodic table may be used in the catalyst of the invention. As used herein, the term "block-d transition metal" refers to element in groups IIB, IVB, VB, VIB, VIII, IB, and IIB of periods 4-7. In some embodiments, the transition metal is one or more of nickel, cobalt, iron, titanium, vanadium, chromium, copper, zinc, molybdenum, and tungsten.

In one embodiment, the metal phosphide is iron phosphide is highly homogeneous FeP orthorhombic nanocrystals. The nanocrystals are spherical in shape with a diameter in the range of 1 nm to 30 nm, preferably 2-25 nm, preferably 3-20 nm, preferably 4-18 nm, preferably 4-15 nm, or 5-10 nm. In a particularly preferred embodiment, the dimeter of the spherical nanoparticles is in the range of 3 to 15 nm. The spherical nanocrystals are distributed evenly covering the surface of the carbon nanosheets. The molar ratio of metal phosphide to carbon nanosheets is in the range of 0.05-0.50, preferably 0.06-0.4, preferably 0.08-0.3, preferably 0.1-0.2, preferably about 0.15.

The carbon nanosheets supporting the transition metal phosphide is produced in a single step by the method described herein below are highly interconnected thin nanosheets with large surface area having thickness of less than 10 nm, less than 9 nm, less than 8 nm, less than 7 nm, less than 6 nm, less than 5 nm, less than 4 nm, less than 3 nm, or less than 2 nm. In some embodiments, the edges of the nanosheets are slightly rolled up resembling the graphene layers. Each sheet comprises at least 1, 2, 3, 4, 5, 6, 10, 15, 20, 25, 30, 40, or 50 layers. The large surface area and the interconnected carbon nanosheets guide the growth FP nanocrystal and uniform distribution on the surface of the nanosheets.

The electrode catalyst is preferably made by a non-hydrolytic method, more preferably a method using a template agent-guide or guiding agent-guide in a non-hydrolytic technique. The method preferably is conducted such that the electrocatalyst is made without electroplating. An oxalate guide is preferably used to form a molybdenum-oxalate complex with carbon nanotubes. In this respect the oxalate acts, in some embodiments, as a guiding agent or template, heating the molybdenum-oxalate complex in the presence of a phosphorus-containing material forms a complex having molybdenum phosphide present on the carbon nanotube surface. This method may be described as a pyrolysis or carbonization process. Other structure-guiding agents or templates may be used. For example, hexamethylene tetraamine (HMT) was used as the structure-guiding agent or templating agent for making cobalt phosphide on carbon nanotubes. First, a complex of cobalt with HMT is formed then subject to heating (pyrolysis) in the presence of carbon nanotubes to form an electrocatalyst having cobalt phosphide on the surface of the carbon nanotubes. In still a further embodiment, the non-hydrolytic method is used to form an iron phosphide carbon nanosheet composite. The carbon nanosheets are preferably interconnected and act as a support for iron phosphide nanoparticles. In this embodiment of the invention, a molecular source of iron is preferably annealed in the presence of a phosphorus source such as sodium hypophosphite ($NaPO_2H_2$) to thereby obtain iron phosphide nanoparticles dispersed on the surface of carbon nanosheets.

The morphological characteristics of the electrocatalyst are shown in FIGS. 2A-H.

When a carbon nanosheet support is used the electrocatalyst has a sponge-like morphology with a plurality of closed and/or partially opened cells having walls defined by carbon nanosheets. The walls of individual cells have a long dimension of from 10-500 nm, preferably 20-400 nm, 50-250 nm, or about 100 nm. Interconnections between nanosheets may form boundaries or define limits of particular cells or pores within the sponge-like structure. The metal phosphide is preferably homogeneously dispersed throughout the electrocatalyst structure on the surfaces of the carbon nanotubes or carbon nanosheets (see for example FIGS. 2A, 2F, 2G, 2H, and 2I. Electrocatalysts formed from carbon nanotube materials have a similar porosity. A plurality of interconnected carbon nanotube forms tunnels and cavities within a larger structure.

Another aspect of the invention is directed to a method of making the electrocatalyst comprising:
preparing the carbon nanosheets by heating a sodium salt of a carboxylic acid at a temperature in the range of 600-1200° C. under inert gas;
adding the nanosheets to a solution of a transition metal salt in a solvent to form a suspension, stirring the suspension for 2-10 hours;
removing the alcohol to produce a powder;
placing the powder and an alkali metal hypophosphite in a weight ratio of 1:80 in two separate crucibles.
heating the crucibles under a flow of inert gas at a temperature in the range of 200-600° C. for 0.5 to 4.0 hours, wherein the crucible containing the sodium hypophosphite is placed up stream relative to that of the powder.

Any suitable carbon source may be utilized to obtain the interconnected carbon nanosheets by pyrolysis in one step described herein. In some embodiment, the carbon source may be one or more mono-, di-, and/or tri-carboxylic acid or salt thereof such as, but not limited to, acetic acid, propionic acid, oxalic acid, succinic acid, malonic acid, glutaric acid, malic acid, fumaric acid, tartaric acid, citric acid, and ammonium, alkali or alkaline earth metal salts thereof such as but not limited to sodium ammonium acetate, sodium oxalate, potassium succinate, sodium citrate and the like. In some embodiments, other oxygen containing compounds may be utilized to obtain the carbon nanosheets such as, but not limited to sugars such as, but not limited to glucose, fructose, sucrose, and polysaccharides such as starch, cellulose, pectin, and the like.

To obtain the carbon nanosheets, the carbon source is heated under inert gas such as, but not limited to nitrogen, helium, and argon to a temperature in the range of 600-1200° C., preferably in the range of 700-1000° C., preferably in the range of 750-950° C., preferably about 800° C. for a time in the range of 0.5 to 4.0 hours, preferably in the range of 1 to 3 hours, preferably in the range of 1.5 to 2.5 hours, and preferably about 2 hours. The resulting carbon nanosheets may be washed with mineral acid at a concentration in the range of 2-15 wt. %, preferably 5-10 wt. %, preferably about 10 wt. %, and deionized water; and dried at a temperature in in the range of 60-120° C., preferably in the range of 70-100° C., preferably in the range of 85-95° C., preferably about 90° C.

The electrocatalyst described herein is also preferably prepared in the absence of a conventional chemical reducing agent such as sodium borohydride.

Likewise, heating the transition metal-guiding agent/CNT complex in the presence of carbon nanotubes or carbon nanosheets is preferably carried out in the absence of a gaseous reducing atmosphere such as in the absence of a hydrogen-containing atmosphere. Further in this regard the transition metal complex that is used as a precursor for the transition metal phosphide may be free of a halogen.

Likewise, heating the transition metal-guiding agent/CNT complex in the presence of carbon nanotubes or carbon nanosheets is preferably carried out in the absence of a gaseous reducing atmosphere such as in the absence of a hydrogen-containing atmosphere. Further in this regard the transition metal complex that is used as a precursor for the transition metal phosphide may be free of a halogen.

Further with respect to the process of preparing the metal phosphide supported electro-catalyst, the preparation methodology is preferably carried out in a "one-step" method that essentially represents a pyrolysis or carbonization of the transition metal complex and a phosphorus source in the presence of the carbon nanotubes or carbon nanosheets. In this aspect of the present disclosure the transition metal precursor does not require a separate reduction step in solution.

Final formation of the electrocatalyst is carried out in a manner that includes heating by carbonization or pyrolysis, preferably as a mixture of the metal complex with carbon nanosheets or carbon nanotubes in the presence of, but physically separated from, a phosphorus source. Preferably the metal complex/CNT mixture is placed in a first container such as a crucible or other container that is capable of withstanding the temperatures necessary for forming the electrocatalyst. A second container which similarly may preferably be a crucible, is maintained physically separate from the first container. Both the first and second containers are subsequently placed in an enclosure such as an oven and heated in the presence of a flow of an inert gas such as nitrogen. Preferably the containers are arranged such that the metal complex/CNT mixture (solid material) is in a downstream location relative to the location of the container containing the phosphorus precursor and relative to the flow of the inert gas. The first and second containers are physically separated such that the solid or liquid contents of the first and second containers do not physically interact with one another. By heating the phosphorus source acts as a phosphidating agent rather than a reducing agent although in some embodiments the phosphorus precursor may also change, for example raise or lower, the oxidation state of the metal.

Preferably the flow of inert gas is sufficient to exchange the volume of the oven or enclosure in which the first and second containers are heated in a period of time of from 1 second to one hour, preferably 10 seconds to 30 minutes, preferably 30 seconds to 10 minutes, or 1 to 5 minutes.

Any suitable transition metal salt from block-d of the periodic table may be utilized in the method. In some embodiments of the method, the transition metal salt is that of nickel, cobalt, iron, titanium, vanadium, chromium, copper, zinc, molybdenum, and/or tungsten. Examples of the transition metal salts include but are not limited to transition metal fluorides, chlorides, bromides, iodides, alkoxides, such as but not limited to methoxide, ethoxide, isopropoxide, and carboxylates such as but not limited to acetate, propionate, succinate, and oxalate. In some preferred embodiment the transition metal salt is $FeCl_2$.

The carbon nanosheets are added to a solution of the transition metal salt in a solvent to form a suspension. The suspension is stirred for a time in the range 1-10 h, preferably in the range of 2-8 h, preferably in the range of 3-7 h, preferably in the range of 4-6 h, and preferably about 5 h; and the solvent is allowed to evaporate at ambient temperature to produce a powder. Any suitable solvent may be used; in particular solvent that is volatile at ambient temperature, to make the transition metal suspension. Examples of suitable solvents include, but are not limited to alcohols such as methanol, ethanol, propanol, isopropanol, and the like, acetone, methyl ethyl ketone, dimethyl ether, methyl ethyl ether, chloroform, methylene chloride, carbon tetrachloride, petroleum ether, and the like. The mixture contains a molar ratio of the transition metal salt to the carbon nanosheets in the range of 0.05-0.50, preferably 0.06-0.4, preferably 0.08-0.3, preferably 0.1-0.2, preferably about 0.15.

Preferably the carbon nanotube or carbon nanosheets used as a support for the metal phosphide in the electrocatalyst described herein is not doped with any other material. For example, the carbon nanotubes order carbon nanosheets are not doped with other transition metal dopants or main group metal dopants (e.g., N, P, etc.). Preferably no nitrogen or phosphorus doping is present on the carbon nanotubes or carbon nanosheets prior to carrying out the non-hydrolytic process. Likewise, the pyrolysis preferably forms an electrocatalyst in which the metal phosphide material is the only basis for the presence of phosphorus on the electrocatalyst. In this embodiment the carbon nanotube or carbon nanosheet electrocatalyst consists of nanoparticles of the metal phosphide present on the surfaces of the carbon nanotubes or carbon nanosheets.

The interconnections of the carbon nanotubes or carbon nanosheets described herein are preferably covalent bonds between carbon atoms of distinct carbon nanotubes or carbon nanosheets. Such covalent bonds serve the purpose of forming a highly interconnected and robust support for the metal phosphide material. The interconnections can represent points at which a first carbon nanotube/nanosheet is at least partially unraveled or opened, for example suffers a defect in the nanotube/nanosheet structure, and at the defect point the carbon or graphene-like material branches from the first carbon nanotube to form a second carbon nanotube/nanosheet. In this respect interconnected carbon nanotube may have an "X", "Y", or "T" structure or structures in which multiple carbon nanotubes/nanosheets are covalently interconnected. Such interconnected carbon nanotubes may have structures similar to the dendrimer structures of highly branched polymer materials. Similar interconnections occur for carbon nanosheets. In some embodiments nanosheets may branch by at least partially peeling so that a single nanosheet branches into multiple nanosheets each having its own continuous structure but covalently connected to one or more core or nucleus nanosheets. Like the carbon nanotubes, the carbon nanosheets described herein can be interconnected to form a template or dendrimer-like structure.

In still further embodiments the interconnections can represent physical or Van der Waals contacts between carbon nanotubes or carbon nanosheets. However, such interconnections between nanotubes or nanosheets do not offer the strength and support properties that are available with covalently interconnected carbon nanotubes or carbon nanosheets.

In a still further embodiment, the transition metal phosphide nanocatalyst is formed by heating an alkali metal hypophosphite such as, but not limited to sodium hypophosphite ($NaPO_2H_2$) or potassium hypophosphite, and the intermediate powder in separate crucibles under flowing inert gas at a temperature in the range of 200° C. to 800° C., preferably in the range of 300° C. to 700° C., preferably in the range of 350° C. to 500° C., and preferably about 400° C., where the alkali metal hypophosphite crucible is placed upstream from that of the intermediate powder relative to the direction of the flowing inert gas. The inert gas can be any gas that does not react with alkali metal hypophosphite or the powder precursor such as nitrogen, helium, argon, and the like. The flow rate of the inert gas is at least 1 mL/min, 2 mL/min, 3 mL/min, 4 mL/min, 5 mL/min, 6 mL/min, 7 mL/min, 8 mL/min, 9 mL/min, 10 mL/min, 15 mL/min, 20 mL/min, and 25 mL/min. The weight ratio of the intermediate powder/alkali metal hypophosphite is at least 0.002, 0.004, 0.006, 0.008, 0.01, 0.02, 0.03, 0.04, 0.05, 0.06, 0.07, 0.08, 0.09, and 0.1. In some embodiment of the invention the weight ratio is about 0.05.

The distance between the two crucibles and the size of the oven/furnace may vary depending on the scale of the preparation. In some embodiments, a laboratory furnace which can be heated to a temperature in the range of 200-1000° C., preferably 300-800° C., and preferably 400-600° C. may be utilized as long as it is large enough to accommodate the two crucibles. In some other embodiment, an intermediate size or a large size oven/furnace may be required to accommodate a large scale preparation. The heated compartment of the oven/furnace is preferably sealed and contains at least one gas inlet and at least one outlet which equipped with a device to control the gas flow. The heating compartment of the oven/furnace may be of any geometrical shape including, but not limited to, spherical, rectangular, and tubular. The oven/furnace may be heated by any mean including but not limited to an electric heater, a gas or oil heater. The distance between the two crucibles in the oven is at least 0.5 cm, 1.0 cm, 2.0 cm, 3 cm, 4 cm, 5 cm, 6, cm, 7 cm, 8 cm, 9 cm, 10 cm.

Another aspect of the invention is directed to a modified electrode comprising an electrically conductive substrate coated with the noble metal free electrocatalyst of the invention. The substrate is any electrically conductive material such as, but not limited to glassy carbon, graphite, gold, platinum, silver, iron, copper, aluminum and the like. The electrode may have any dimension and shape. For example, the shape of electrode may be cylindrical rode or plate, or rectangular sheet or block. In some embodiments, the electrode is cylindrical and has a dimeter at least 1, 2, 3, 4, 5, 6, 7, 8, 9, or 10 mm and a surface area of at least 0.05, 0.10, 0.15, 0.20, 0.25, 0.30, 0.35, 0.40, 0.45, 0.50 $cm^2$. The electrode is coated with a composition comprising the electrocatalyst of the invention. The modified electrode has a catalyst loading in the range of 0.1-15 $mg/cm^2$, preferably in the range of 0.2-10 $mg/cm^2$, preferably in the range of 0.3-5 $mg/cm^2$, preferably in the range of 0.5-2 $mg/cm^2$, and preferably about 1.0 $mg/cm^2$ of the surface of the electrode.

In some embodiments, the BET surface area of the modified electrode is in the range of 100 to 300 $m^2/g$, preferably in the range of 125 to 275 $m^2/g$, preferably in the range of 140 to 230 $m^2/g$, preferably in the range of 160 to 180 $m^2/g$, preferably about 167 $m^2/g$.

In addition to the large electroactive surface area, the electrode of the invention has many desirable characteristics that enhance its performance in an electrochemical reaction, in particular, the electrolysis reaction of water to produce hydrogen. It has an estimated over potential to produce a current density of 10 $mAm^{-2}$ in acidic condition in the range of 200-50 mV, preferably in the range of 160-70 mV, preferably in the range of 140-90 mV, preferably in the range of 110-100 mV, preferably about 104 mV. Another feature of the electrode of the invention is that it has a charge transfer resistance (Rct) of less than 150 $\Omega cm^2$, preferably less than 100 $\Omega cm^2$, preferably less than 50 $\Omega cm^2$, preferably less than 25 $\Omega cm^2$, preferably less than 15 $\Omega cm^2$, preferably less than 10 $\Omega cm^2$, preferably less than 6 $\Omega cm^2$ at 90 mV. Also, it has a turnover frequency in the range 1.00-0.2 $s^{-1}$, preferably in the range 0.90-0.30 $s^{-1}$, preferably in the range 0.80-0.40 $s^{-1}$, preferably in the range 0.70-0.50 $s^{-1}$, and preferably about 0.55 $s^{-1}$.

Any electrically conductive substrate may be modified to produce the electrode of the invention. Generally the substrate is modified by a coating comprising the electrocatalyst of the present invention and a binder. The catalyst of the invention and a binder may be wet blended in the presence of a suitable solvent or dry blended using a mortar or other conventionally known mixing equipment. The mixture may then be applied to the surface of the substrate by conventionally known methods. Any electrically conductive substrate may be employed. Preferred electrically conductive substrate include but not limited to glassy carbon, graphite, graphene, iron, copper, aluminum, gold, silver, platinum, and the like.

Suitable binders known to one of ordinary skill which are chemically stable in the potential window of use of an electrochemical cell may include thermoplastics and thermosetting resins. For example, polyethylene, polypropylene, polytetrafluoroethylene (PTFE), polyvinylidene fluoride (PVDF), styrene butadiene rubber, a tetrafluoroethylene hexafluoro ethylene copolymer, a tetrafluoroethylene hexafluoropropylene copolymer (FEP), a tetrafluoroethylene perfluoroalkyl vinyl ether copolymer (PFA), ethylene-tetrafluoroethylene copolymer (ETFE resin), polychlorotrifluoroethylene resin (PCTFE), a propylene-tetrafluoroethylene copolymer, an ethylene-chlorotrifluoroethylene copolymer (ECTFE). Additionally, water soluble binders including branched polyethyleneimine (bPEI), an ethylene-acrylic acid copolymer such as poly 2-acrylamido-2-methylpropane sulfonic acid (PAMPS) and NAFION® copolymer may be employed as binder. These binders may be used independently, or mixtures may be used.

In some preferred embodiments, the binder is a conductive polymer, also described as electroactive polymer. The conductive polymers comprise inherently conductive polymers (ICP) and conductive plastics. The latter are traditional plastics, such as thermoplastics, that may include conductive fillers, such as powdered metals or carbon (e.g., carbon black or fiber). The conductive polymer may be biocompatible conductive polymers that are made ionically conductive and that are mechanically stable over a desired period of time, such as, for example, polypyrrole. In further embodiments the conductive polymer may include, for example, polynaphthalene, polythiophene, NAFION® copolymer, polyethylene oxide, and polyethyldioxythiophene (PEDOT). Other classes of conductive polymers include polyacetylenes, conductive polypyrrole polystyrene sulfonate, polythiophenes (PT), and polyanilines. Conductive polymers may also include EHPT (poly(3-(2-ethylhexyl)thiophene), ionomers (e.g., NAFION® copolymer), poly(3,4 ethylene dioxythiophene) (PEDOT) and PEDOT polystyrene sulfonate (PSS/PEDOT).

In some embodiments, NAFION® copolymer is used as a binder which is a trade name for sulfonated tetrafluoroethylene based fluoropolymer-copolymer has and has the chemical formula $C_7HF_{13}O_5SC_2H_4$. This polymer's ionic properties are a result of incorporating perfluorovinyl ether groups terminated with sulfonate groups onto a tetrafluoroethylene (PTFE) backbone. NAFION® copolymer can be used as a proton conductor for proton exchange membrane (PEM) fuel cells because of its excellent thermal and mechanical stability. It can be produced as both a powder resin and a copolymer. It has various chemical configurations and thus, several chemical names in the IUPAC system. NAFION®-H copolymer, for example, includes the following systematic names in Chemical Abstract including ethanesulfonyl fluoride, 2-[1-[difluoro-[(trifluoroethenyl)oxy]methyl]-1,2,2,2-tetrafluoroethoxy]-1,1,2,2,-tetrafluoro-, with tetrafluoroethylene; and tetrafluoroethylene-perfluoro-3,6-dioxa-4-methyl-7-octenesulfonic acid copolymer. The molecular weight of NAFION® copolymer may vary due to differences in processing and solution morphology. A preferred structure for a NAFION® copolymer unit is:

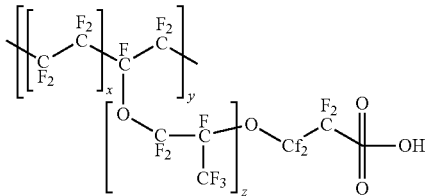

This structure illustrates the variability of the material; for example, the most basic monomer contains chain variation between the ether groups (the z subscript). The molecular weight has been estimated at 105-106 Da. Equivalent weight (EW) and material thickness are used to describe most commercially available NAFION® copolymer membranes. The EW is the number of grams of dry NAFION® copolymer per mole of sulfonic acid groups when the material is in the acid form.

In some embodiments of the method, the binder is added to a suspension of the catalyst in aqueous organic solvent in an amount in the range of 0.001-0.010 wt. %, preferably in the range in the range of 0.002-0.008 wt. %, preferably in the range of 0.003-0.006 wt. %, in the range of 0.004-0.005 wt. % of the weight of the catalyst to form a mixture. Any volatile organic solvent miscible with water may be used such as methanol, ethanol, propanol, isopropanol, acetone and the like may be used as a solvent to obtain the mixture. The mixture is deposited on the surface of the substrate and the solvent is allowed to evaporate and the process is repeated until the desired catalyst loading is achieved.

Another aspect of the invention is directed to an electrochemical cell comprising the electrode of the invention as a working electrode, a counter electrode and an electrolyte, wherein the electrolyte is covering the surfaces of the electrodes. In some preferred embodiments, the electrolyte is aqueous acid or alkali or alkaline earth metal hydroxide solution. Any mineral acid may be utilized such as but not limited to hydrochloric acid, sulfuric acid, and nitric acid. In a preferred embodiment sulfuric acid is used as an electrolyte. Any alkali or alkaline earth metal hydroxide such as but not limited to lithium hydroxide, sodium hydroxide, potassium hydroxide, calcium hydroxide, magnesium hydroxide, and the like may be used as an electrolyte. The concentration of the electrolyte in cell is in the range of 0.1-2.0 M, preferably in the range of 0.2-1.8 M, preferably in the range of 0.3-1.5, preferably in the range of 0.4-1.2, and preferably in the range of 0.5-1.0 M. In particularly preferred embodiments, the electrolyte is sulfuric acid at a concentration of about 0.5M. In some other preferred embodiment, the electrolyte is potassium or sodium hydroxide at a concentration of about 1.0 M.

In a preferred embodiment, the disclosed electrochemical cell is intended for used in a method to produce hydrogen from water. In some preferred embodiment sulfuric acid is used as an electrolyte. In some other embodiment, sodium or potassium hydroxide is used as an electrolyte. The method involve applying a potential of at least −1.23 V, preferably at least −1.5, preferably at −2.0 V at a temperature of at least 20° C., preferably at least 30° C., preferably at least 40° C., preferably at least 60° C., preferably at least 80° C., and preferably at least 95° C.

Example 1

Preparation of Interconnected Ultrathin Carbon Nanosheets (CN):

Approximately 5 gm of sodium citrate was placed in an alumina crucible and the crucible was heated gradually by increasing the temperature at a rate of 3° C. min$^{-1}$ in a tube furnace under flow of nitrogen to 800° C. The crucible was maintained at 800° C. for 2 h and the resulting product was collected and washed with 10% hydrochloric acid and with deionized water. Finally, the product was dried at 90° C. in an oven.

Preparation of Iron Phosphide/Carbon Nanosheets (FeP/CN):

A measured amount (40 mg) of iron chloride (FeCl$_2$) was dissolved in ethanol, followed by addition of the as-prepared carbon nanosheets (25 mg) in a capped vial. The solution was kept under stirring for 5 h at room temperature. Subsequently, the suspension was poured on a petri dish and the solvent was allowed to evaporate under a vigorous stirring at ambient conditions. Upon solvent evaporation, a black powder was obtained which was dried at 90° C. overnight. Finally, the desired amount of as-prepared precursor and sodium hypophosphite (NaPO$_2$H$_2$) was placed in two separate alumina crucibles and transferred in a tube furnace under the flow of nitrogen. The weight ratio of precursor and NaPO$_2$H$_2$ was 1:20. The NaPO$_2$H$_2$ was placed at the upstream side relative to the black powder and the direction of the nitrogen flow in the furnace. The temperature of furnace was raised to 400° C. with heating rate of 3° C. min$^{-1}$, and maintained for 2 h. Then, the product was collected and used as electrocatalyst for HER reaction. For comparison, FeP nanoparticles were also prepared following the same method, but without carbon nanosheets.

Example 2

Characterization:

Morphological and detailed microstructural characteristics of the prepared materials were determined with field emission scanning electron microscope (FESEM, Tescan Lyra-3), transmission and high-resolution transmission electron microscope (TEM/HR-TEM, FEI Tecnai TF20). Other techniques employed for characterization of the samples were: X-ray diffraction (XRD, Rigaku MiniFlex), BET surface area analyzer (Micromeritics ChemiSorb 2750) and X-ray photoelectron spectroscopy (XPS, Thermo Scientific ESCALAB 250Xi).

Figure 1B:
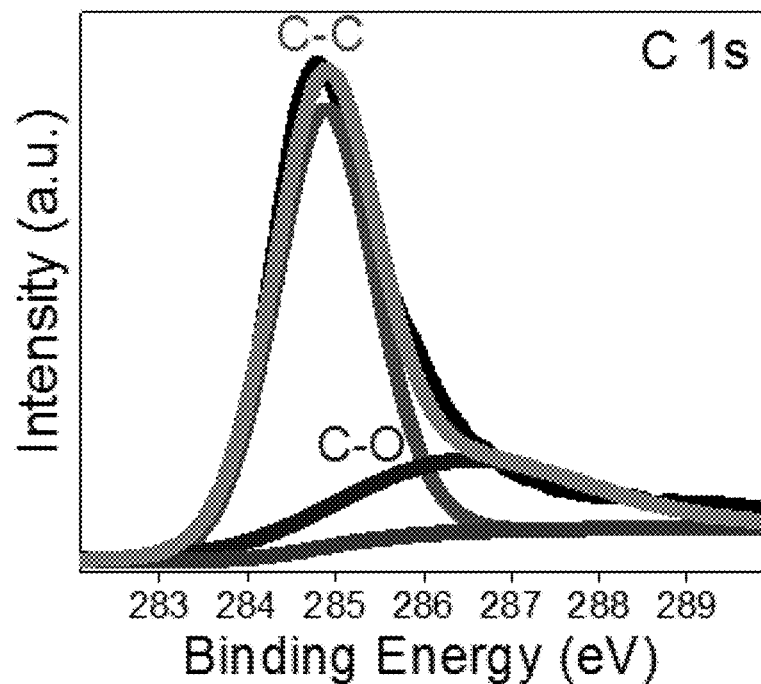
FIG. 1B shows X-ray photoelectron spectrum (XPS) of FeP/CN confirming the presence of carbon nanosheets.
Figure 1C:
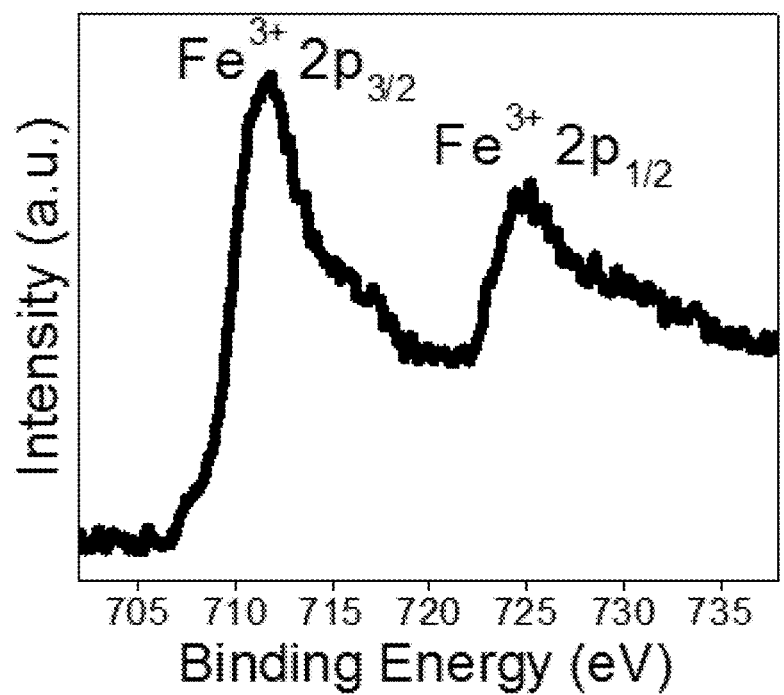
FIG. 1C shows XPS of FeP/CN.
Figure 1D:
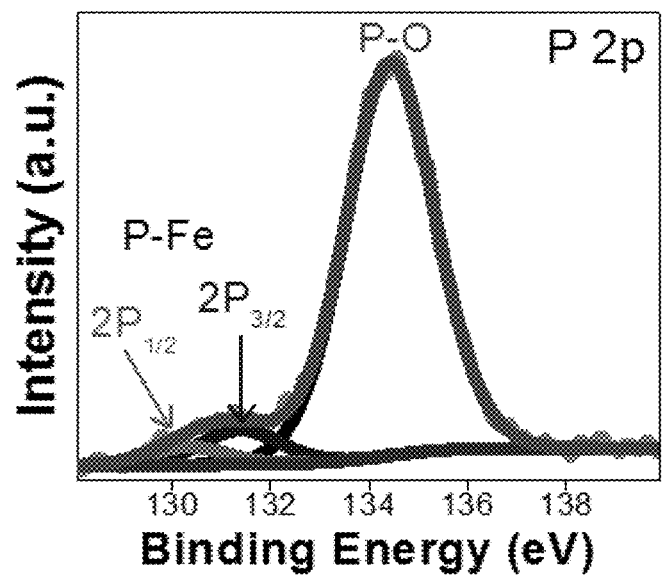
FIG. 1D shows XPS of FeP/CN.

Structural characterization of FeP/CN:

Powder X-ray diffraction of FeP/CN is shown in FIG. 1A. Broad and low-intensity diffractions centered at 26.5° and 43.2° correspond to (002) and (100) planes of carbon, and indicate that carbon nanosheets are of amorphous characteristics [Shang et al. "Preparing high surface area porous carbon from biomass by carbonization in a molten salt medium" RSC Adv. 5 (2015) 75728-75734]. The diffraction peaks located at 32.8° (011), 37.2° (111), 48.3° (211), and 56.10 (013) are attributed to FeP with a orthorhombic structure (JCPDS 65-2595) [Han et al. "Well-dispersed and porous FeP@C nanoplates with stable and ultrafast lithium storage performance through conversion reaction mechanism" J. Mater. Chem. A 4 (2016) 12781-12789—incorporated herein by reference in its entirety]. FIGS. 1B-1D show details of the chemical compositions and oxidation states analyzed by X-ray photoelectron spectroscopy (XPS). Survey spectrum, not shown here, corroborated the elemental compositions, which included iron (Fe), phosphorous (P), and carbon (C). In the spectrum of C is (FIG. 1B), presence of C—O (at 286.5 eV) groups in the layers of as-prepared FeP/CN was registered, besides characteristic peak of graphitic carbon at 284.9 eV [Yan et al. "Construction of efficient 3D gas evolution electrocatalyst for hydrogen evolution: porous FeP nanowire arrays on graphene sheets" Adv. Sci. 2 (2015) 1500120-1500128—incorporated herein by reference in its entirety]. In the Fe 2p spectrum (FIG. 1C), the peaks centered at 711.6 and 724.8 eV account for Fe$^{3+}$ 2p$_{3/2}$ and Fe$^{3+}$2p$_{1/2}$ respectively, which agrees well with those reported in the literature for Fe coordinated to P [Liu et al. (2014); Lv et al. (2016); and Zhang et al. (2014)—incorporated herein by reference in its entirety]. The peaks at 130.3 and 131.4 eV in the P 2p spectrum (FIG. 1D) are ascribed to 2p$_{3/2}$ and 2p$_{1/2}$ of P bonded to Fe [Khan et al. "Remarkable adsorptive performance of a metal-organic framework, vanadium-benzenedicarboxylate (MIL-47), for benzothiophene" Chem. Commun. 2011, 47, 1306-1308—incorporated herein by reference in its entirety]. In addition, the intense and broad peak observed at 134.4 eV is assigned to PO$_4^{-3}$ [Zhang et al. (2014)—incorporated herein by reference in its entirety].

Figure 2A:
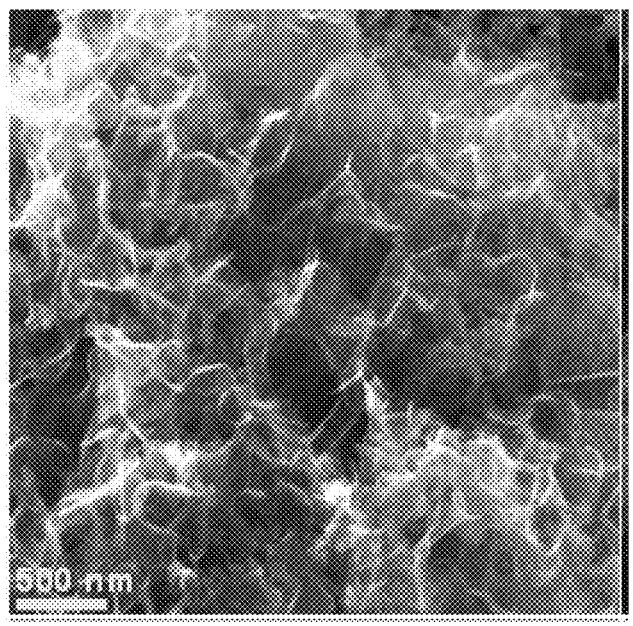
FIG. 2A shows field emission scanning electron microscope (FESEM) of carbon nanosheets at magnification of 2.5×.
Figure 2B:
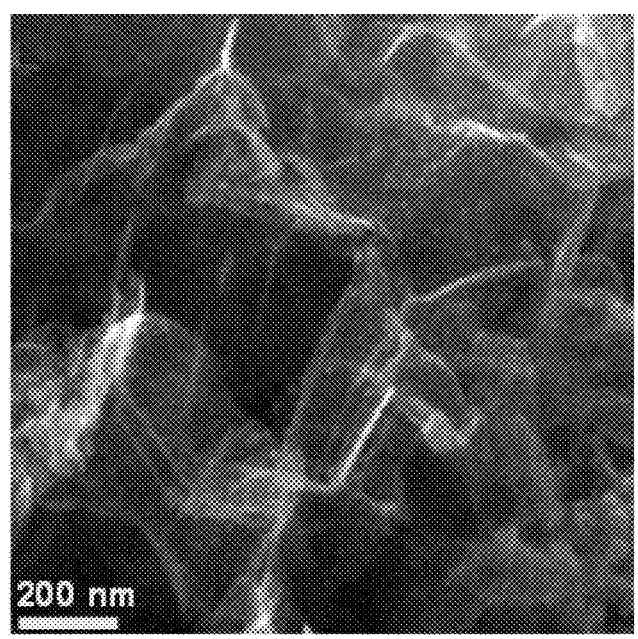
FIG. 2B shows field emission scanning electron microscope (FESEM) of carbon nanosheets at magnification of 1×.
Figure 2C:
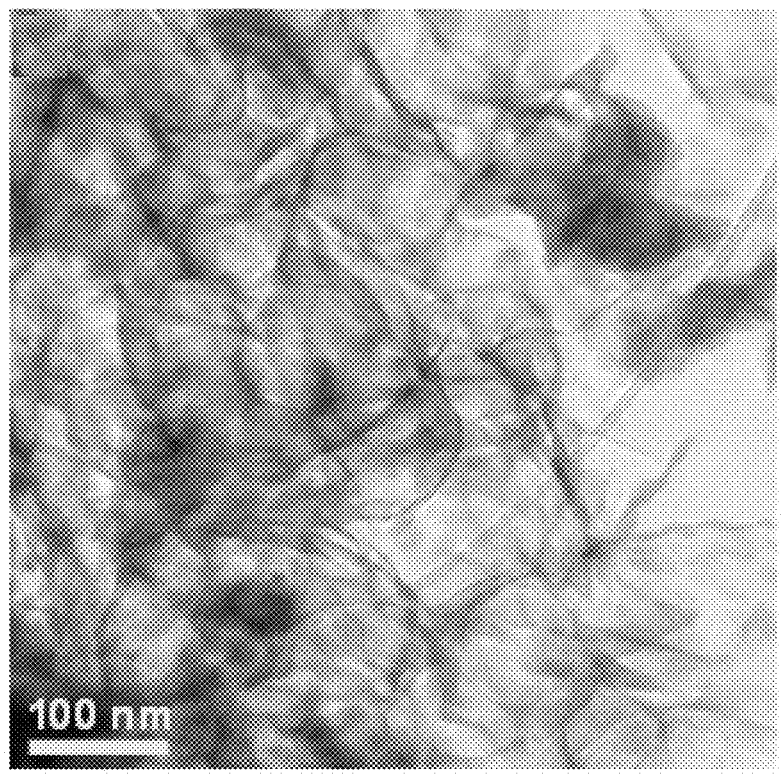
FIG. 2C shows a transmission electron microscopy (TEM) of carbon nanosheets.
Figure 2D:
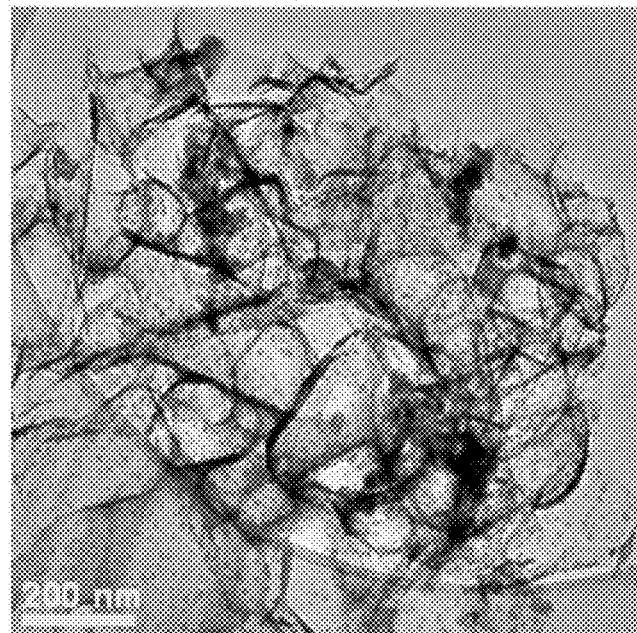
FIG. 2D shows high-resolution transmission electron microscope (TEM/HR-TEM) of FeP/CN at 1× magnification.
Figure 2E:
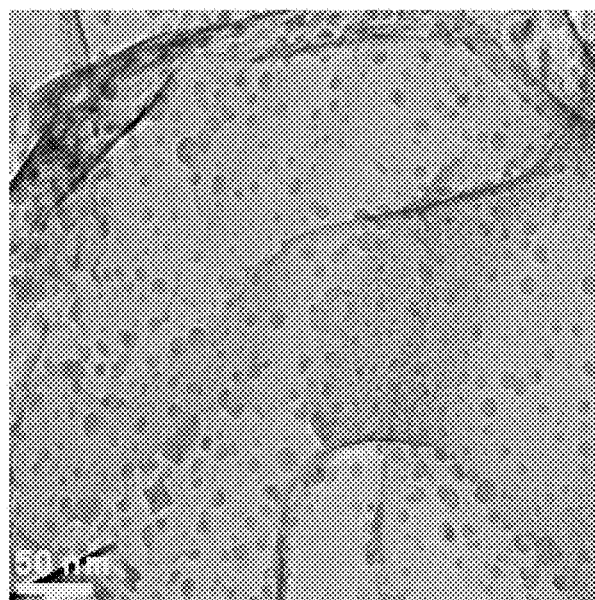
FIG. 2E shows TEM/HR-TEM of FeP/CN at 2× magnification.
Figure 2F:
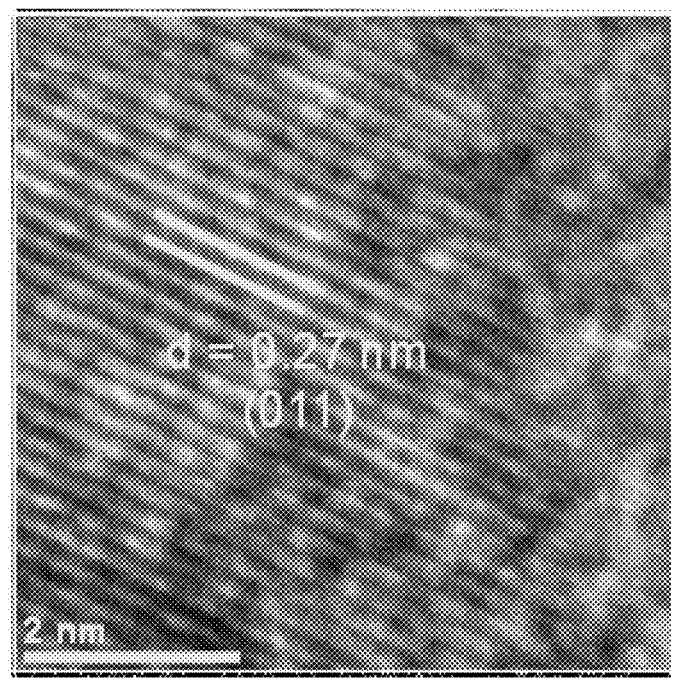
FIG. 2F shows TEM/HR-TEM of FeP/CN at 200× magnification.
Figure 2G:
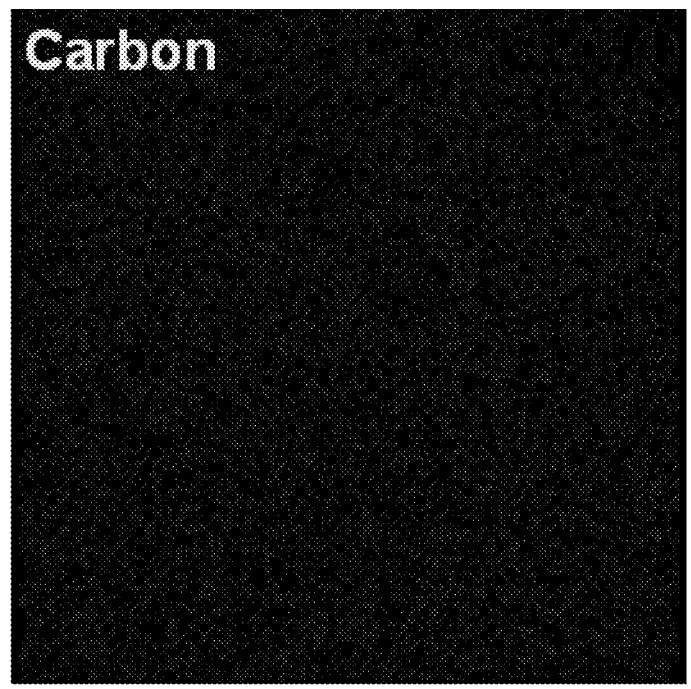
FIG. 2G shows elemental mapping of carbon.
Figure 2H:
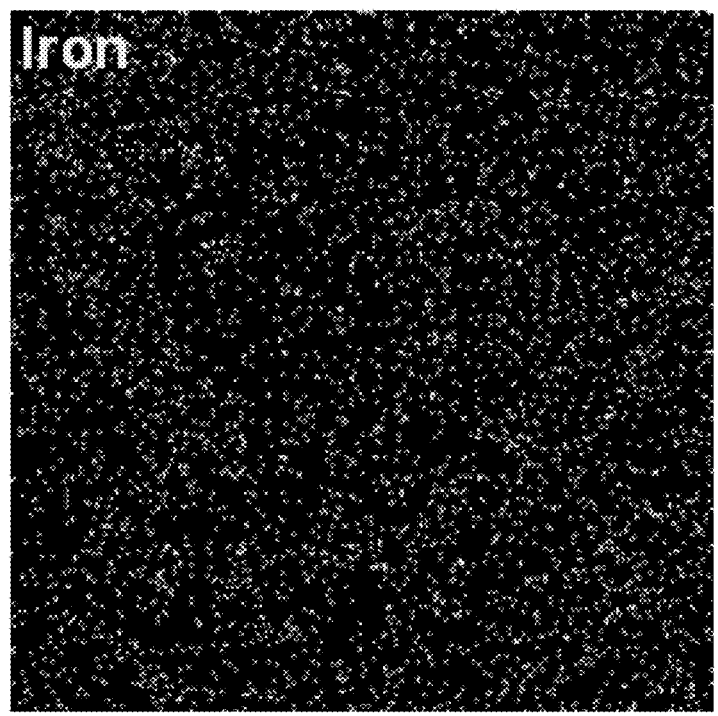
FIG. 2H shows elemental mapping of iron.
Figure 2I:
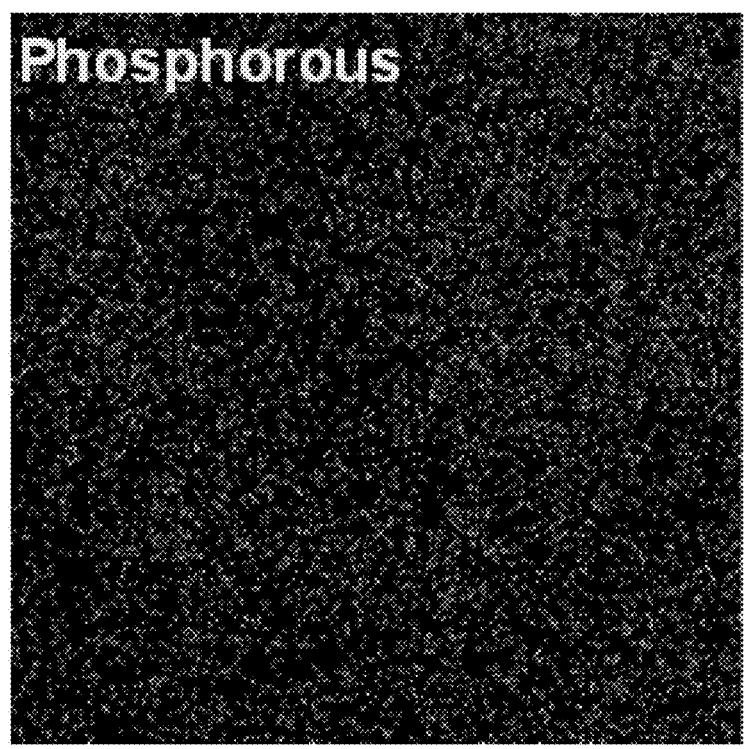
FIG. 2I shows elemental mapping of phosphorus.

Microstructural and morphological features of carbon nanosheets and FeP/CN were collected with the aid of SEM and TEM. FESEM image of carbon directly derived from carbonization of sodium citrate (FIG. 2A) clearly indicates the presence of homogeneous and interconnected carbon nanosheets which is corroborated by low-magnification TEM analysis (FIG. 2C). The edges of nanosheets are slightly rolled up resembling the characteristics of graphene layers. Each sheet consists of several layers, and the thickness of nanosheets was determined by TEM, which is estimated to be <5 nm. The FESEM image of FeP/CN (FIG. 2B) indicates homogeneous distribution of fine-grained FeP nanoparticles on carbon nanosheets, which also corroborated by TEM analysis. The TEM images shown in FIGS. 2D and 2E highlight the size, morphology and homogeneity of FeP dispersed on nanosheets. The FeP nanoparticles were highly homogeneous and spherical in shape with size in the range of 3 to 15 nm, uniformly distributed across the surface of carbon nanosheets. This finding shows that the use of carbon in the form of ultrathin nanosheets modifies the self-assembling behavior of molecular iron and renders discrete nucleation and growth of fine and uniformly dispersed FeP after phosphidation. The HR-TEM microscopy image of FeP (FIG. 2F) shows high degree of crystallinity. The interplanar distance is estimated to be 0.27 nm, in good agreement with 0.27 nm based on XRD data for the (011) plane. Elemental mapping of FeP/CN was performed electron probe analyzer, and the results for C, Fe and P are shown in FIGS. 2G-2I. The FIGS. show that all the elements seemed to be evenly distributed throughout the surface of nanosheets.

Example 3

Electrochemical Characterization:
Preparation of FeP/CN Working Electrode:

Working electrode was prepared by sonicating slurry of electrocatalyst (5 mg) in 5 mL water and ethanol (50% v/v) and 40 µl of 1.66% wt. Nafion® [Perfluorosulfonic acid-PTFE copolymer, Alfa Aesar] for approximately 30 min. The sonicated solution was dropped on a pre-cleaned glassy carbon (GC) disc electrode (5.0 mm diameter, 0.196 cm$^2$, Pine Instruments), and dried at ambient conditions. The deposition steps were repeated to achieve catalyst loading of 1 mg/cm$^2$.

Electrochemical Measurements:

The electrocatalytic activity was examined in a three-electrode cell, connected to a potentiostat (EG&G 273A) at ambient conditions. The cell contained saturated calomel electrode (Hg/HgCl$_2$, SCE) and graphite rod as reference and the counter electrode, respectively, as well as a working electrode. The SCE potential was converted and presented against reversible hydrogen electrode (RHE). Linear sweep voltammetry was performed in a 1.0 M KOH or 0.5 M H$_2$SO$_4$ aqueous solution at a scan rate of 5 mV/s. The galvanostatic measurement was performed in a 0.5 M H$_2$SO$_4$ aqueous solution in the current range of 20 mA to 0.01 µA at a scan rate of 0.1 mA/s [Karimi et al. "Evaluation of the Surface Roughness of Ni—Zn—P Electrodes by in situ Methods", J. Appl. Electrochem., 29 (1999) 979—incorporated herein by reference in its entirety]. All current densities were normalized to the geometric area of the glassy carbon electrode and presented after iR compensation. Electrochemical impedance spectroscopy (EIS) measurements were carried out in 0.5 M H$_2$SO$_4$ between the frequency range of 10$^5$ Hz and 0.01 Hz with ac amplitude of 10 mV. All the EIS data was normalized to the geometric area of the working electrode. All the electrochemical measurements were carried out in electrolyte solution saturated with hydrogen gas.

Calculation of Turnover Frequency (TOF):

To elucidate the active sites, TOF was estimated using the Equation 1 [Wang et al. (2017)—incorporated herein by reference in its entirety]:

$$TOF = JA/2FN \quad (1)$$

where, J (A/cm$^2$) is the geometric current density recorded during the linear sweep voltammograms (LSV) measurement in 0.5 M H$_2$SO$_4$, A is the geometric area of the glassy carbon electrode GC (0.196 cm$^2$), ½ denotes that two electrons are required to form one hydrogen molecule from water, F is the Faraday constant (96485 C/mol), N is the number of active sites (mol). N was determined by carrying out CV measurements between −0.2 V and +0.6 V$_{RHE}$ in 1.0 M phosphate buffer solution with a scan rate of 20 mV/s. While it is difficult to assign the observed peaks to a given redox couple, N should be proportional to the integrated charge over the whole potential range. Assuming a one electron redox reaction, the upper limit of active sites was calculated by equation 2:

$$N = Q/2F \quad (2)$$

where Q is voltammetric charge.

Evaluation of Electrocatalytic Performance Towards Hydrogen Evolution Reactions (HER):

The activity of as-synthesized electrocatalysts was evaluated towards hydrogen evolution reaction (HER) both in acidic (0.5 M H$_2$SO$_4$) and basic (1.0 M KOH) aqueous electrolytes. The current density was normalized to geometric area of the glassy carbon electrode. Before recording the linear sweep voltammograms (LSV), working electrodes were swept for 10 cycles between +0.1 and −0.3 V$_{RHE}$ to allow interface to attain equilibrium, if any.

Figure 3A:
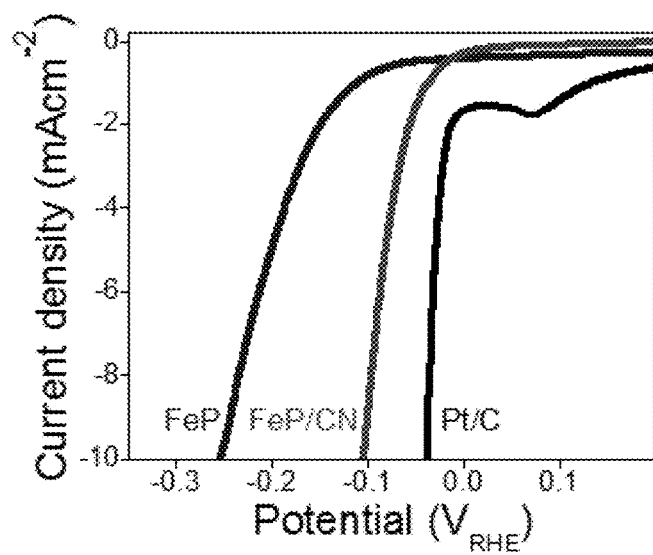
FIG. 3A shows the polarization curves of FP, FeP/CN, and Pt/C in acidic medium.
Figure 3B:
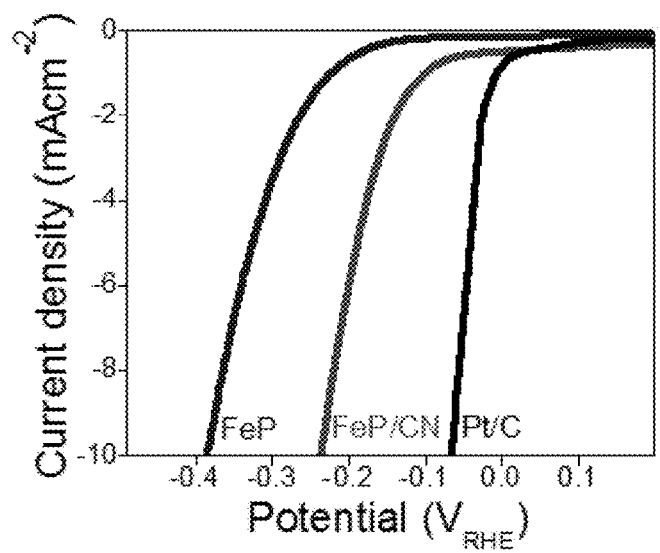
FIG. 3B shows the polarization curves of FP, FeP/CN, and Pt/C in basic medium.

Comparative Electrocatalytic Performance:

The performance of FeP/CN electrode is compared with that of FeP nanoparticles and commercial Pt/C. Comparative electrocatalytic performance was carried out under identical experimental conditions with the same mass of catalyst loaded on GC electrode. Cathodic polarization (current density vs. potential) profiles under acidic and basic media are shown in FIGS. 3A and 3B, respectively. Under acidic conditions, the overpotentials estimated to produce current density of 10 mA/cm$^2$ were ~41, ~104 and ~254 for Pt/C, FeP/CN and FeP electrode, respectively. Table 1 compares the activity of as-synthesized FeP/CN electrode with FeP-based electrocatalysts reported in the literature. The performance is compared in terms of potential required to produce a current density of 10 mA/cm$^2$ per geometric area; a standard or benchmark current density [Wang et al. (2017); and Faber et al. (2014)—both incorporated herein by reference in their entirety]. Also the performance is compared with other porous electrodes (Table 1) for higher current densities. As could be seen, the requirement of HER overpotential for as-prepared FeP/CN electrode compares favorably to most of the carbon-supported FeP electrodes reported as yet. For instance, FeP dispersed on graphene sheets required overpotential 123 mV [Zhang et al. (2014)—incorporated herein by reference in its entirety]. In another study, the electrode comprising candle soot supported-FeP required 112 mV [Zhang et al. (2015)—incorporated herein by reference in its entirety]. Also, phosphorus doped single wall carbon nanotubes are utilized as support for nanoparticles of iron phosphide electrode. Such an electrode required overpotential of ~145 mV [Lv et al. (2016)—incorporated herein by reference in its entirety]. An electrode comprising iron phosphide/nitrogen-doped carbon nanotubes required 113 mV [Liu et al. (2014)—incorporated herein by reference in its entirety]. It is noteworthy, however, that high efficiency electrodes are usually obtained with the electrocatalysts supported on carbon cloth and metallic substrate such as titanium foil. A similar activity trend, though requiring higher potential as compared to acidic electrolyte, was observed in basic electrolyte. For identical current density, respective potentials were calculated to be ~65, ~235 and ~385 mV. The electrode comprising FeP/CN required substantially lower potential as compared to that of FeP nanoparticles. Superior performance of FeP/CN electrode could be ascribed to improved dispersion of FeP on carbon nanosheets, as discerned through microscopy.

TABLE 1

The HER activity comparison between FeP/CN and carbon-based electrocatalysts and porous electrocatalysts[a]

| Electrocatalyst (Reference)[b] | Electrolyte | Overpotential | | |
|---|---|---|---|---|
| | | $\eta_{10\ mAcm^{-2}}$ | $\eta_{100\ mAcm^{-2}}$ | $\eta_{250\ mAcm^{-2}}$ |
| FeP-NPs (1) | H$_2$SO$_4$ | 151 | — | — |
| FeP/N-CNT (2) | H$_2$SO$_4$ | 130 | — | — |
| FeP-FeC @P-doped SWNT (3) | H$_2$SO$_4$ | 150 | — | — |
| Candle soot- FeP (4) | H$_2$SO$_4$ | 121 | — | — |
| FeP NWs/rGO (5) | H$_2$SO$_4$ | 107 | — | — |
| FeP/CNT (6) | KOH | 110 | — | — |
| FexP @NPC (7) | H$_2$SO$_4$ | 227 | — | — |
| FeP-NA/CC (8) | H$_2$SO$_4$ | 58 | — | — |
| FeP-NW/CF (9) | H$_2$SO$_4$ | 45 | — | — |
| Fe$_2$P-ND/FG (10) | H$_2$SO$_4$ | 91 | — | — |
| FePNTs (11) | H$_2$SO$_4$ | 88 | — | — |
| FeP-NW (12) | H$_2$SO$_4$ | 96 | — | — |
| FeP$_2$-NW (12) | H$_2$SO$_4$ | 61 | — | — |
| Porous Ni$_3$Al (13) | KOH | — | >1340 | — |
| Porous Ni/Zn (14) | NaOH | — | 301 | — |
| Porous NiP (15) | KOH | — | 248 | — |

TABLE 1-continued

The HER activity comparison between FeP/CN and carbon-based electrocatalysts and porous electrocatalysts[a]

| Electrocatalyst (Reference)[b] | Electrolyte | Overpotential | | |
|---|---|---|---|---|
| | | $\eta_{10\ mAcm^{-2}}$ | $\eta_{100\ mAcm^{-2}}$ | $\eta_{250\ mAcm^{-2}}$ |
| Porous Ni-Mo-P (16) | KOH | — | — | 359 |
| PorousNiAl$_{5.95}$Mo$_{0.66}$ (17) | KOH | — | — | 67 |
| FeP/CN (This work) | H$_2$SO$_4$ | 104 | 262 | 475 |

[a]Abreviation: NA: nanoarray, NW: nanowire, NPs: nanoparticles, CC: carbon cloth, CF: carbon fiber, ND/FG: nanodot/fluffy graphene sheet, and NTs: nanotubes.
[b]References:
(1) Tian et al. ACS Catal. 6 (2016) 5441-5448;
(2) Liu et al. Electrochim. Acta 149 (2014) 324-329;
(3) Lv et al. J. Mater. Chem. A 4 (2016) 13336-13343;
(4) Zhang et al. Nanoscale 7 (2015B) 4400-4405;
(5) Yan et al. Adv. Sci. 2 (2015) 1500120-1500128;
(6) Yan et al. J. Mater. Chem. A. 4 (2016) 13005-13010,
(7) Cheng et al. Nano Energy. 35 (2017) 115-120;
(8) Liang et al. ACS Catal. 4 (2014) 4065-4069;
(9) Lv et al. J. Mater. Chem. A. 4 (2016) 1454-1460;
(10) Huang et al. J. Mater. Chem. A. 4 (2016) 16028-16035;
(11) Yan et al. Chem. Eur. J. 21 (2015) 18062-18067;
(12) Son et al. Chem. Commun. 52 (2016) 2819-2822;
(13) Dong et al. Int. J. Hydrogen Energy. 36 (2011) 12112-12120;
(14) Hitz et al. J. Electroanal. Chem. 500 (2001) 213-222;
(15) Łosiewicz et al. Int. J. Hydrogen Energy. 29 (2004) 145-157;
(16) Shervedani et al. J. Electrochem. Soc. 145 (1998) 2219-2225; and
(17) Birry et al. J. Appl. Electrochem. 34 (2004) 735.

Figure 3C:
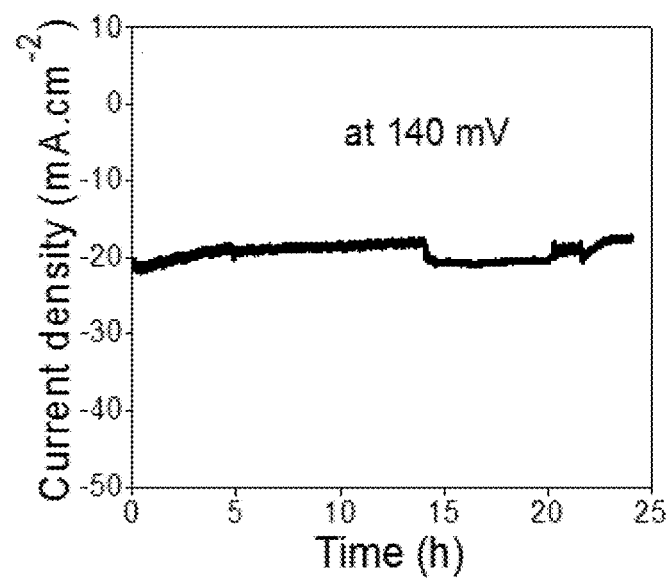
FIG. 3C shows current-time curve of FeP/CN, confirming steady $H_2$ production for 24.
Figure 3D:
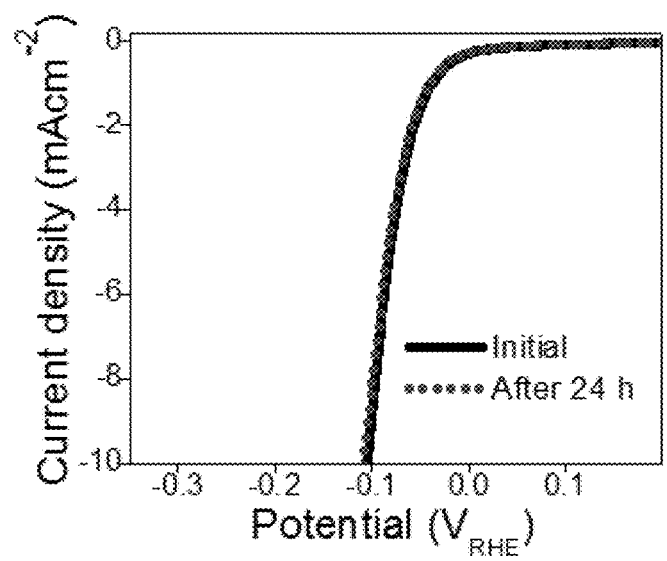
FIG. 3D shows polarization curves for FeP/CN in acidic medium obtained before and after 24 h potentiostatic experiments, indicating excellent electrochemical stability of the electrode.

Evaluation of Electrode Stability:

FIG. 3C shows a time-dependent profile of current density at constant applied potential of 140 mV for FeP/CN electrode having catalyst loading of 1 mg/cm$^2$ in 0.5 M H$_2$SO$_4$. A steady current flow was observed over >24 h without any noticeable drop in the current density indicating the stability of the electrode. After 24 h of potentiostatic experiment, the used-electrode was re-polarized under the same conditions and current density was quantified as a function of potential. Polarization curves recorded before and after potential hold test are compared in FIG. 3D. As evident, the required overpotential to drive 20 mA/cm$^2$ remained almost unchanged, indicating excellent endurance of the electrode.

Figure 4A:
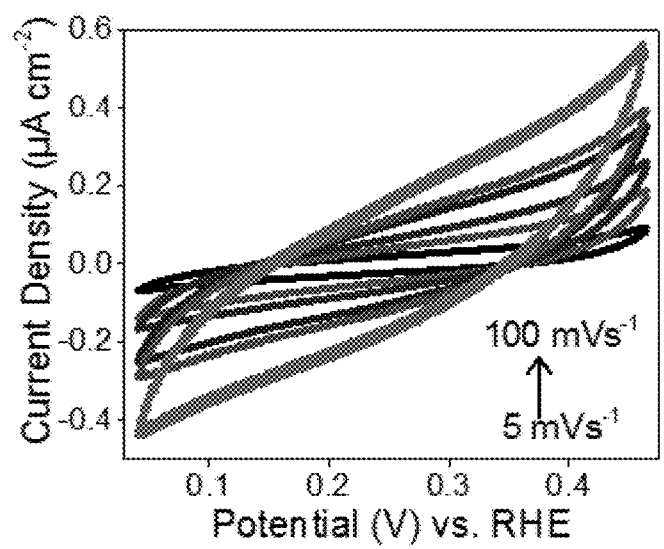
FIG. 4A shows cyclic voltammograms recorded for FeP nanoparticles in 0.5 M $H_2SO_4$ aqueous electrolyte at different scan rates between 5 and 100 mV/s.
Figure 4B:
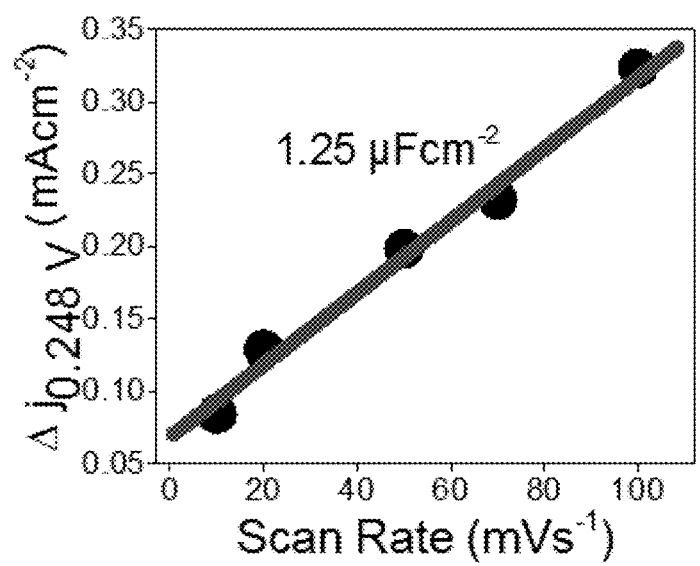
FIG. 4B shows a plot of the current density at 0.248 $V_{RHE}$ vs. scan rate for FeP nanoparticles.
Figure 4C:
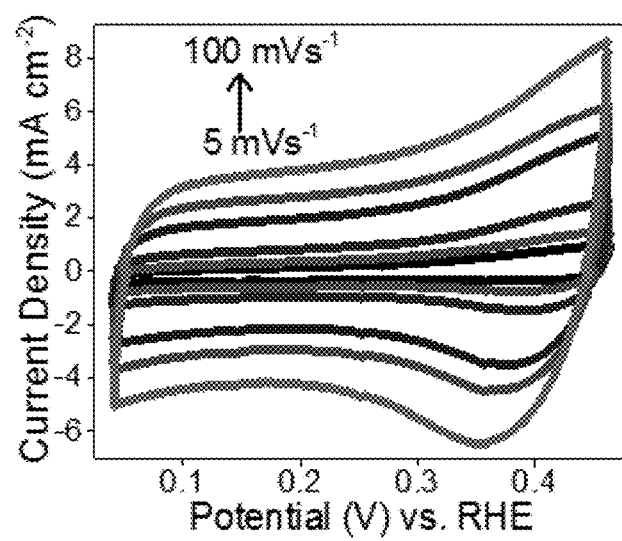
FIG. 4C shows cyclic voltammograms recorded for FeP/CN nanoparticles in 0.5 M $H_2SO_4$ aqueous electrolyte at different scan rates between 5 and 100 mV/s.
Figure 4D:
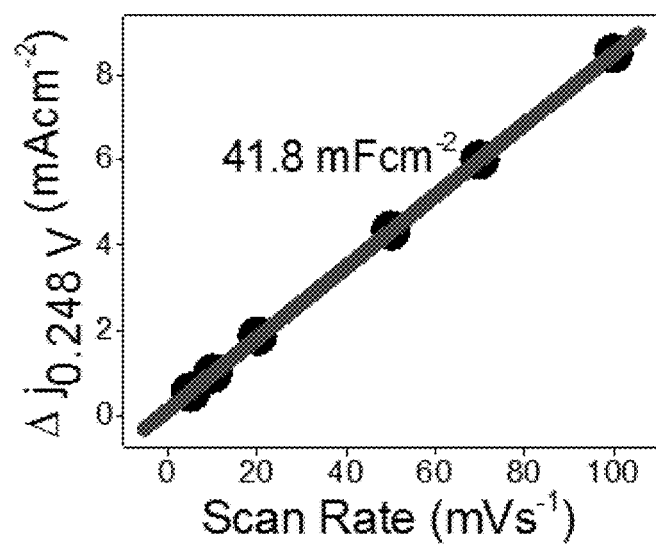
FIG. 4D shows a plot of the current density at 0.248 $V_{RHE}$ vs. scan rate for FeP/CN nanoparticles.
Figure 4E:
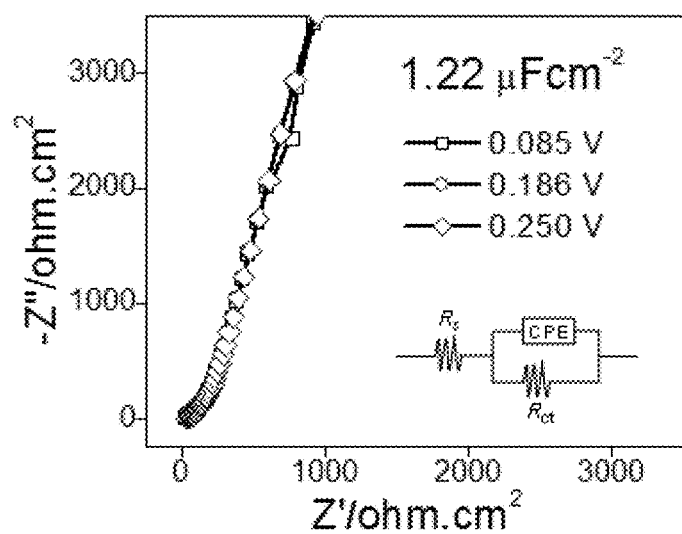
FIG. 4E shows Nyquist plots of FeP nanoparticles in 0.5 M $H_2SO_4$ aqueous electrolyte. In set shows the one time constant model R(QR) used.
Figure 4F:
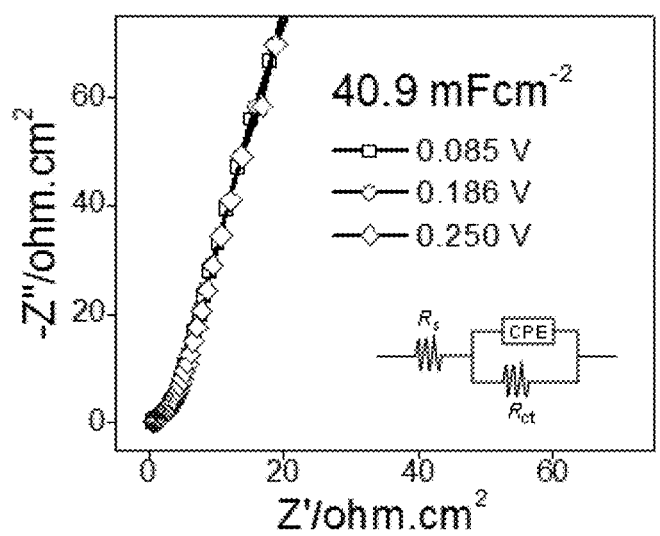
FIG. 4F shows Nyquist plots of FeP/CN nanoparticles in 0.5 M $H_2SO_4$ aqueous electrolyte confirming the ECSA values estimated by CVs. The inset shows the one time constant model R(QR) used.

Estimation of Electrochemically Active Surface Area (ECSA):

The enhanced performance of FeP/CN electrode compared to that of FeP correlated to electrochemical active surface area (ECSA), charge transfer resistance ($R_{ct}$) and turnover frequency (TOF). The BET surface areas of pure FeP and FeP/CN were measured to be 43.9 and 167 m$^2$/g, respectively. The ECSA of the electrodes was quantified by measuring double layer capacitance ($C_{dl}$) of cyclic voltammograms (CVs) recorded at different scan rates. Usually, higher $C_{dl}$ translates into higher electrochemically accessible area. The CVs with corresponding plots for FeP and FeP/CN electrodes are shown in FIGS. 4A and 4C, respectively. The FeP/CN electrode exhibited $C_{dl}$~41.8 mF/cm$^2$, whereas that of FeP electrode ~1.25 μF/cm$^2$. These estimated ECSA values were further verified by electrochemical impedance spectroscopy (EIS). $C_{dl}$ was calculated by recording Nyquist plots in the non-faradic potential range between 0.085 and 0.25 V [Jurczakowski et al. "Impedance of porous Au based electrodes" J. Electroanal. Chem. 572 (2004) 355-366; and McCrory et al. "Benchmarking heterogeneous electrocatalysts for the oxygen evolution reaction" J. Am. Chem. Soc. 2013, 135, 16977-16987—incorporated herein by reference in their entirety]. The data was fitted employing one-time constant model, R(QR), shown in the inset of FIGS. 4E and 4F for FeP and FeP/CN, respectively. The values calculated from EIS measurements are 1.22 μF/cm$^2$ and 40.9 mF/cm$^2$ for FeP and FeP/CN, respectively, and they are in good agreement to those obtained by cyclic voltammetry experiments.

Figure 5A:
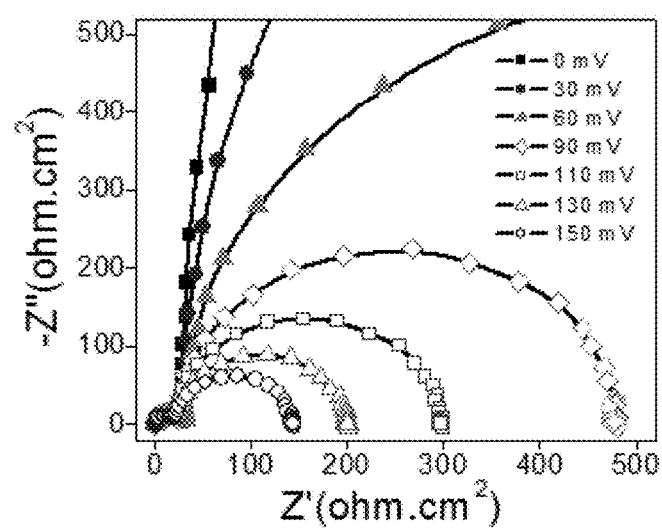
FIG. 5A shows the potential-dependent Nyquist plots of FeP nanoparticles in 0.5 M $H_2SO_4$ measured at the cathodic overpotentials.
Figure 5B:
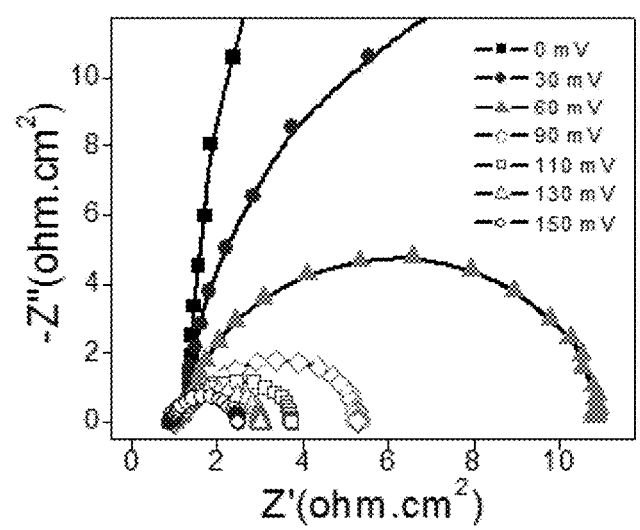
FIG. 5B shows the potential-dependent Nyquist plots of FeP/CN nanoparticles in 0.5 M $H_2SO_4$ measured at the cathodic overpotentials.
Figure 5C:
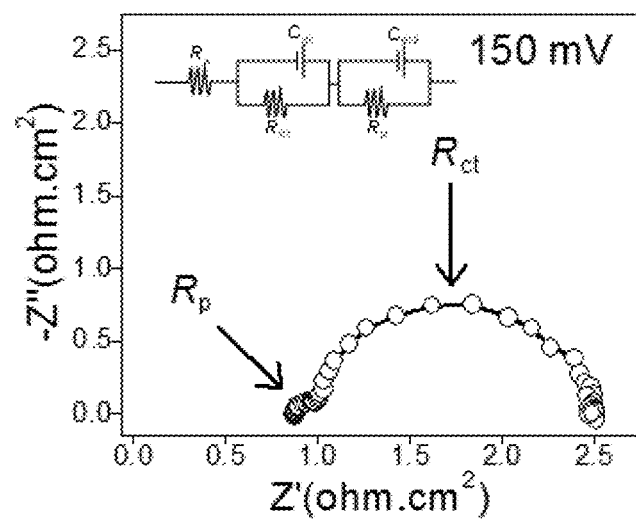
FIG. 5C shows Nyquist plots of FeP/CN nanoparticles at 150 mV showing the presence of two time constant in 0.5 M $H_2SO_4$ measured at the cathodic overpotentials. In set, the two-time constant parallel model is shown.
Figure 5D:
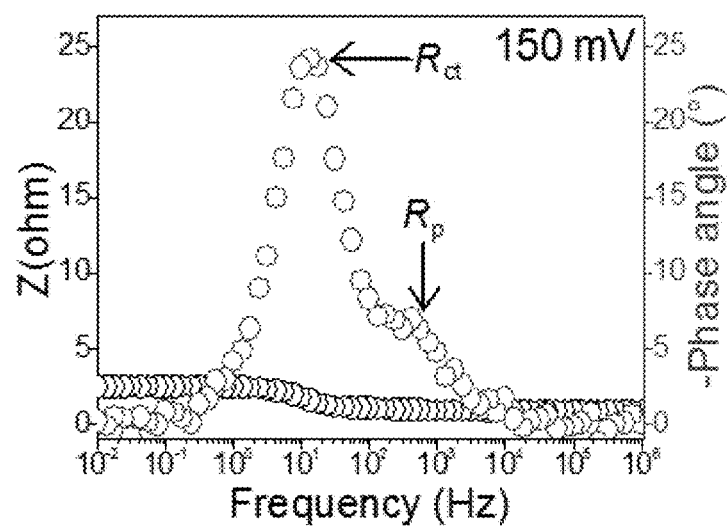
FIG. 5D shows Bode plots of FeP/CN nanoparticles at 150 mV showing the presence of two time constant in 0.5 M $H_2SO_4$ measured at the cathodic overpotentials.
Figure 5E:
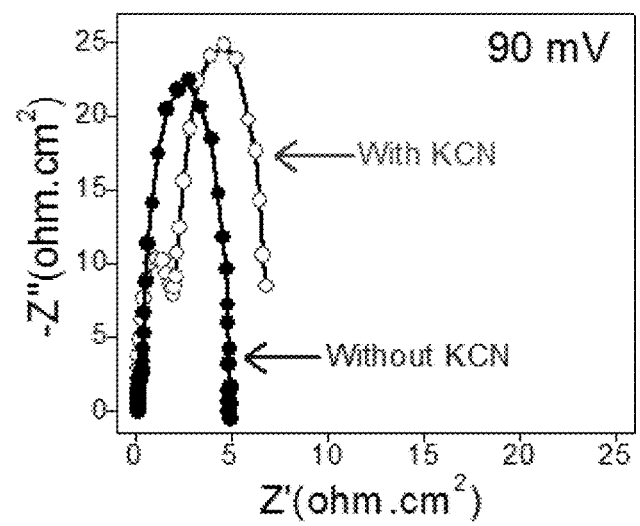
FIG. 5E shows Nyquist plots of FeP/CN nanoparticles in the presence and absence of $2 \times 10^{-2}$ M KCN in 1.0 M KOH solution measured at the cathodic overpotentials.

Estimation of Electrochemical Impedance:

Electrochemical impedance spectroscopy (EIS) is employed to obtain further kinetic insights into electrical conductivity and surface charge transfer resistance. All the measurements are performed from 10$^5$ Hz to 0.01 Hz with an amplitude of 10 mV at different cathodic or negative overpotentials ($\eta$=0 to 150 mV vs. RHE) in acidic medium. Potential-dependent Nyquist plots of FeP and FeP/CN electrodes are shown in FIGS. 5A and 5B, respectively. The result indicated a significant dependency of surface charge transfer on the applied potential as the charge transfer resistance ($R_{ct}$) decreased with increasing overpotential. That implied faster charge transfer kinetics at high overpotential. For instance, $R_{ct}$ values of FeP/CN electrode decreased noticeably from ~11 Ωcm$^2$ at 60 mV to approximately 2.5 Ωcm$^2$ at 150 mV overpotential. When $R_{ct}$ of both FeP/CN and FeP electrodes were compared, the former exhibits much faster charge transfer kinetics at all applied potential. For instance, at 90 mV, $R_{ct}$ for FeP and FeP/CN electrodes are estimated to be ~480 Ωcm$^2$ and ~5.2 Ωcm$^2$, respectively. This is attributable to smaller particle size and uniform dispersion of FeP nanoparticles on carbon nanosheets. The EIS findings for hydrogen evolution reaction have been predominantly construed by three types of electrical equivalent circuit models; one-time constant model, two-time constant parallel model, and two-time constant serial model [Khan et al. (2011); Lu et al. "Highly porous non-precious bimetallic electrocatalysts for efficient hydrogen evolution" Nat. Commun. 6 (2015) 6567-6574; and Wan et al. "Leonard, Multiple phases of molybdenum carbide as electrocatalysts for the hydrogen evolution reaction" Angew. Chem. Int. Ed. 53 (2014) 6407-6410]. Based on Nyquist and Bode plots, the two-time constant parallel model (in set FIG. 5C) was fit to the experimental data. The model consists of solution resistance ($R_s$) in series with two parallel constant phase element-resistance, where $R_s$ constitutes a collective resistance which includes the resistance coming from wiring ($R_{wiring}$), carbon support ($R_{carbon}$), resistance of FeP ($R_{FeP}$), and the solution resistance ($R_{soln}$) [Zhang et al. "Constructing free standing metal organic framework MIL-53 membrane based on anodized aluminum oxide precursor" Sci. Rep. 4 (2014) 4947-4952—incorporated herein in its entirety]. For both the electrodes, the Nyquist plot indicated the presence of two semicircles. For instance, the Nyquist plots of electrode comprising FeP/CN recorded at 150 mV is shown in FIG. 5C. Corresponding Bode plot, shown in FIG. 5D, corroborates the presence of two-time constants in FeP/CN. The semicircle observed at higher frequency could be attributed to the surface porosity, while the other semicircle at lower frequency corresponds to the charge transfer process of hydrogen evolution reaction. The resistance ($R_p$=0.16 Ωcm$^2$) caused by high frequency semicircle was found to be independent of applied potential, suggesting a porous nature of the surface. This was further substantiated by performing the measurement in the presence of 5×10-2 M potassium cyanide (KCN) in the electrolytic solution. This experiment was carried out in alkaline medium to avoid the reaction between KCN and H$_2$SO$_4$, which releases lethal hydrogen cyanide (HCN) gas. The Nyquist plots were recorded before and after the addition of KCN, and the results are shown in FIG. 5E. As evident, the diameter of both the semicircles increased in the presence of KCN compare to those in the absence of KCN, showing that these resistances are related to electrode kinetics [Birry et al.

Figure 5F:
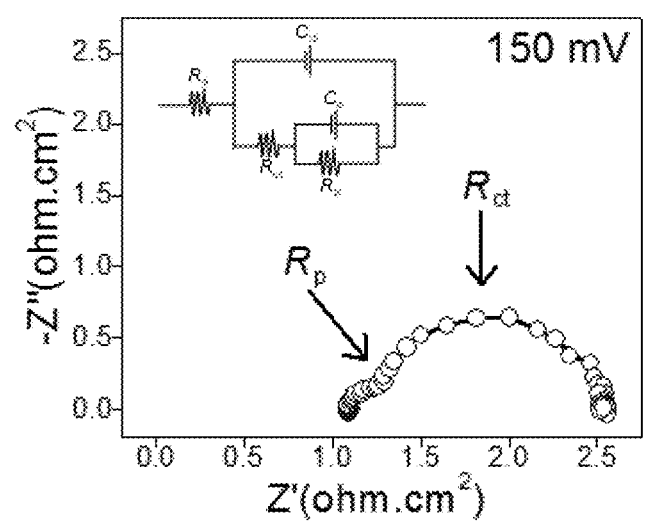
FIG. 5F shows Nyquist plots of FeP/CN nanoparticles at 150 mV fitted with 1CPE model measured at the cathodic overpotentials.
Figure 6A:
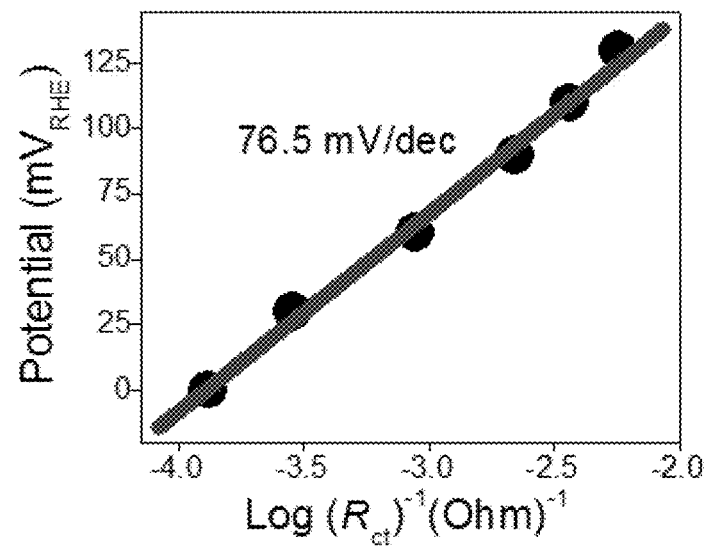
FIG. 6A shows the Tafel slope for FeP estimated from EIS.
Figure 6B:
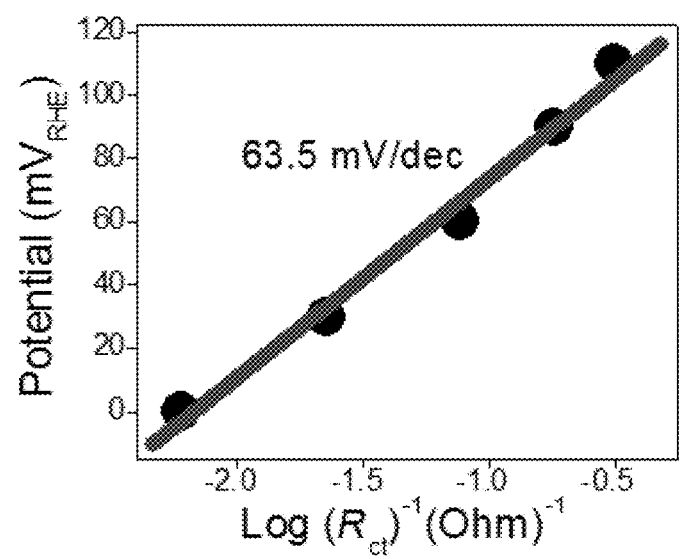
FIG. 6B shows the Tafel slope for FeP/CN estimated from EIS.
Figure 6C:
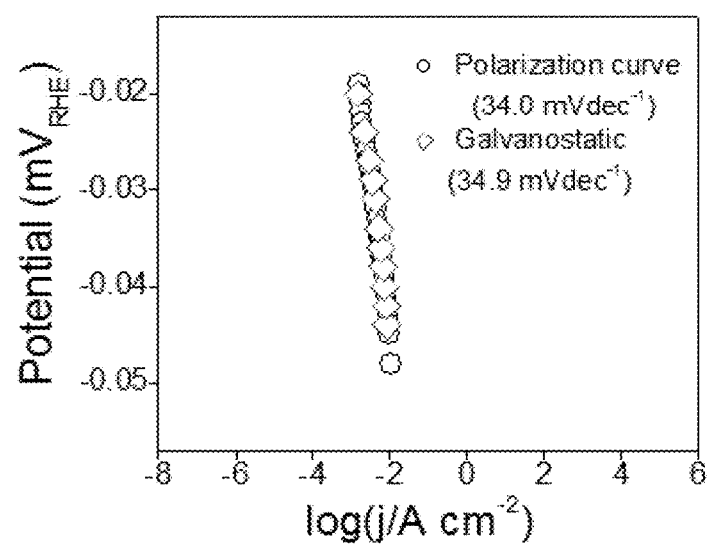
FIG. 6C shows the Tafel slope for Pt/C estimated from polarization curves and galvanostatic measurement.
Figure 6D:
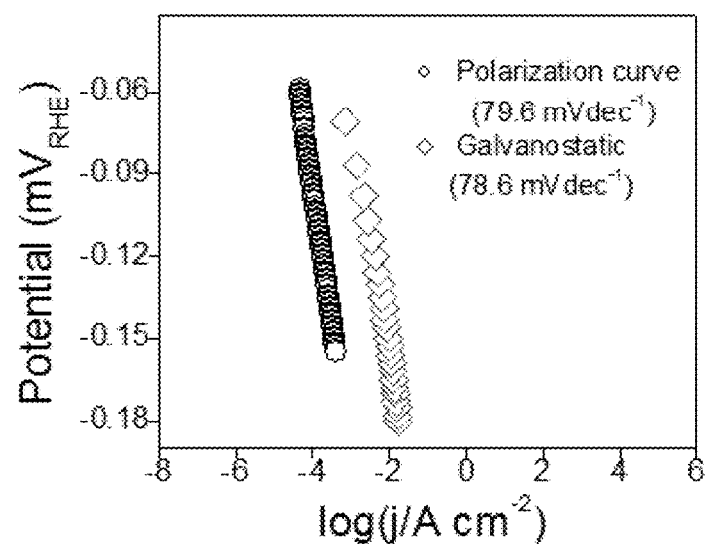
FIG. 6D shows the Tafel slope for FeP estimated from polarization curves and galvanostatic measurement.
Figure 6E:
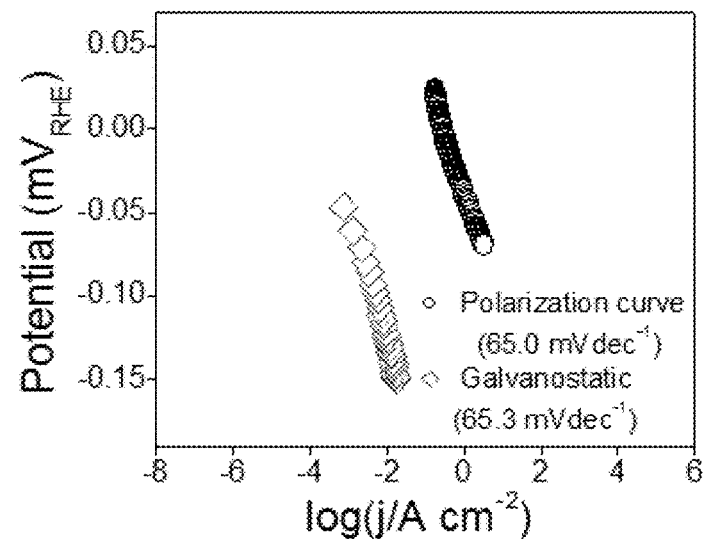
FIG. 6E shows the Tafel slope for FeP/CN estimated from polarization curves and galvanostatic measurement.

"Studies of the hydrogen evolution reaction on Raney nickel-molybdenum electrodes" J. Appl. Electrochem. 34 (2004) 735, incorporated herein by reference in its entirety]. For electrode kinetics related to the porous surface, another equivalent circuit models, 1CPE ($R_s(C_{dl}(R_{ct}(R_pC_p))$), may also be used to approximate the experimental complex plane plots. The result obtained with 1CPE circuit model is shown in FIG. 5F. A comparative analysis of the test F suggests that both equivalent circuit models are valid to approximate the complex plots.

Estimation of Tafel Slope:

In acidic electrolyte, HER proceeds following two different mechanisms, which includes three probable reactions: (1) Volmer reaction (adsorption), (2) Tafel reaction (chemical desorption), and (3) Heyrovsky reaction (electrochemical desorption), as shown below [Shi et al. (2016)].

Step I: $H^+(aq)+e^- \longrightarrow H_{ads}$ Volmer reaction (adsorption)

Step II: $H_{ads}+H_{ads} \longrightarrow H_2(g)$ Tafel reaction (chemical desorption)

Step III: $H_{ads}+H^+(aq)+e^- \longrightarrow H_2(g)$ Heyrovsky reaction (electrochemical desorption)

FIG. 6 shows the Tafel slopes of the electrodes determined from EIS, polarization curve of FIG. 3A and galvanostatic measurements. Tafel slopes estimated from EIS results represent entirely charge transport kinetics. Calculation of the semi-logarithmic values of the inverse of Rct against η results in a linear relationship with a gradient, which corresponds to the Tafel slope. Respective slopes of FeP and FeP/CN electrodes are shown in FIGS. 6A and 6B. The Tafel values are calculated to be 76.5 and 63.5 mV/dec. Tafel slopes of Pt/C, FeP, and FeP/CN calculated from LSV and galvanostatic experiment are shown in FIGS. 6C-6E, respectively. As evident, the values estimated by EIS, polarization curve and galvanostatic measurement are comparable.

Figure 7A:
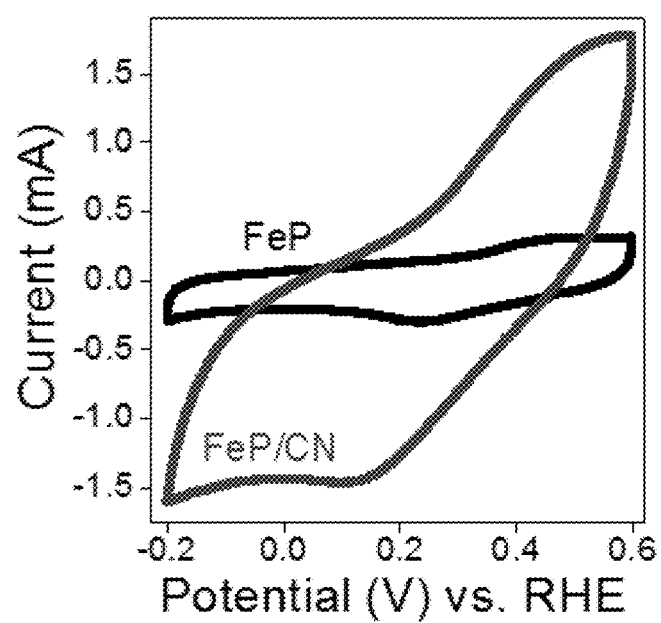
FIG. 7A shows a comparison of the cyclic voltammograms of FeP/CN and FeP electrodes recorded between −0.2 V and +0.6 $V_{RHE}$ 7.
Figure 7B:
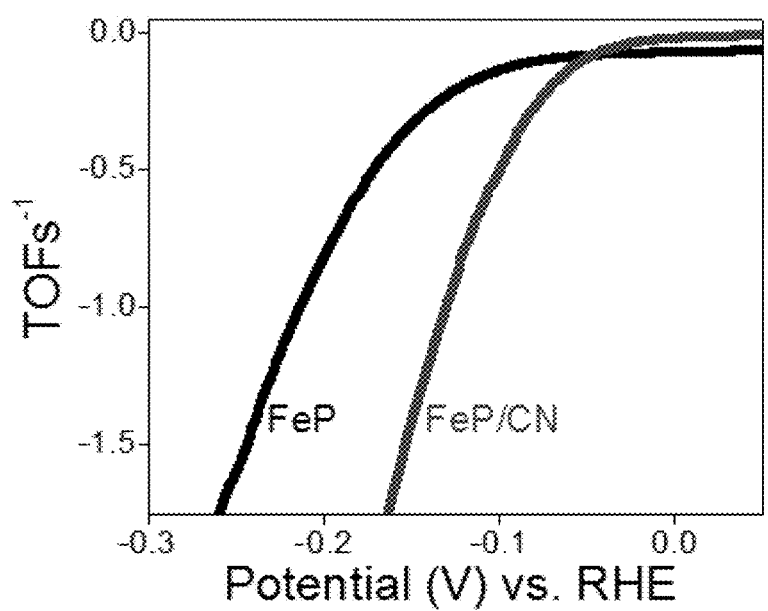
FIG. 7B shows a plot of TOF vs. potential in in a phosphate buffer solution with pH 7.

Estimation of Turnover Frequency (TOF):

The intrinsic catalytic ability of electrodes comprising FeP/CN and FeP towards HER is evaluated by estimating the turnover frequency (TOF). TOF relates to the number of reactant molecules reacted per active site in unit time. Higher TOF values are translated into higher catalytic efficiency. In addition, as the electrocatalytic performance depends on catalysts mass deposited on working electrode (catalyst loading) and usually measurements are performed with different mass loadings, estimation of TOF would allow the comparison of catalytic performance of electrocatalysts reported in the literature [Wang et al. (2017)]. Initially, the number of active sites was quantified by electrochemical method. FIG. 7A compares the cyclic voltammograms of FeP/CN and FeP electrodes recorded between −0.2 V and +0.6 $V_{RHE}$. Measurements were conducted in neutral phosphate buffer solution at pH=7 with a scan rate of 20 mV/s. The number of active sites for FeP/CN and FeP was calculated to be $1.83 \times 10^{-8}$ and $0.62 \times 10^{-8}$ mole, respectively. The number of active sites was used to determine TOF using equation (1). The TOF are plotted against potential, as shown in FIG. 7B. At η=104 mV (the required potential to drive a geometric current density of 10 mA), FeP/CN electrode exhibits significantly higher TOF (0.55 $s^{-1}$) as compared to FeP (0.14 $s^{-1}$). This could presumably be attributed to uniform dispersion of FeP on carbon nanosheets, which renders more functional sites accessible for H+.

The ultrathin and interconnected nanosheets of carbon were obtained in a single step by pyrolysis of low cost sodium citrate as an effective support for the electrocatalyst FeP nanoparticles prepared as described herein. Due to the large surface area and unique morphological features, carbon nanosheets guided the growth of fine-grained FeP nanocrystals dispersed uniformly on the surface of the interconnected nanosheets. Small particle size with improved dispersion has provided performance enhancements to an electrode coated with the supported nanocatalyst such as small surface-charge-resistance, large specific and electrochemically active surface area and high turnover frequency. As a result, the electrode exhibited remarkable hydrogen evolution reaction, requiring only 104 mV to produce 10 mA/cm² in acidic electrolyte. Estimated value of Tafel slope confirmed that electrochemical desorption (Heyrovsky reaction) was the rate-determining step. The findings of this study reveal a simple, cost-effective and scalable synthesis of ultrathin and interconnected carbon nanosheets, and its use as a robust support for the discrete nucleation and growth of active sites.

The invention claimed is:

1. An electrochemical cell, comprising:
   a working electrode,
   a counter electrode,
   a reference electrode, and
   an electrolyte;
   wherein the working electrode comprises an electrically conductive substrate coated with an electrocatalyst, the electrocatalyst comprising:
     nanoparticles of an iron phosphide;
     carbon nanosheets as a catalyst support; and
     a sulfonated fluoropolymer-copolymer binder;
     wherein the carbon nanosheets have no nitrogen or phosphorus doping, and
   the carbon nanosheets are interconnected with covalent carbon-carbon bonds,
     wherein the carbon nanosheets branch by at least partially peeling so that a single nanosheet branches into multiple nanosheets each individually having a continuous structure but covalently connected to one or more core or nucleus nanosheets,
     wherein the nanoparticles have an average diameter in the range of from 3 to 30 nm, and the carbon nanosheets have a thickness of no more than 3 nm,
     wherein the molar ratio of the nanoparticles of the iron phosphide to the carbon nanosheets is in a range of from 0.15 to 0.3,
   wherein the working electrode has a BET surface area in a range of from 140 to 200 m²/g,
   wherein the working electrode has a hydrogen evolution reaction turnover frequency in a range of from 0.90 to 0.30 $s^{-1}$, and
   wherein the working electrode has an overpotential in a hydrogen evolution reaction to produce a current density of 10 mA/cm² in acidic conditions in a range of from 50 to 104 mV.

2. The electrochemical cell of claim 1, wherein the electrolyte is an aqueous alkali metal hydroxide or a mineral acid at a concentration in a range of from 0.1 to 2.0 M.

3. The electrochemical cell of claim 1, wherein the electrolyte is 0.5 M aqueous sulfuric acid.

4. The electrochemical cell of claim 1, wherein the nanoparticles of the working electrode are homogenous spherical nanoparticles having a diameter in a range of from 2 to 20 nm.

5. The electrochemical cell of claim 1, wherein the electrocatalyst of the working electrode is present on a surface of the working electrode in a range of from 0.2 to 10 mg/cm².

6. The electrochemical cell of claim 1, wherein the BET surface area of the working electrode is in the range of from 160 to 180 m$^2$/g.

7. The electrochemical cell of claim 1, wherein the electrically conductive substrate of the working electrode is selected from the group consisting of glassy carbon, graphite, gold, platinum, silver, iron, copper, and aluminum.

8. The electrochemical cell of claim 1, wherein the nanoparticles of the working electrode have an average diameter in a range of from greater than 4 to 15 nm.

9. The electrochemical cell of claim 1, wherein the turnover frequency of the working electrode is in a range of from 0.70 to 0.50 s$^{-1}$ and the overpotential to produce the current density of 10 mA/cm$^2$ in acidic conditions is in a range of from 100 to 104 mV.

10. The electrochemical cell of claim 1, wherein the electrocatalyst of the working electrode is present on a surface of the working electrode in an amount in a range of from 1 to 2 mg/cm$^2$, and the iron phosphide is supported on interconnected carbon nanosheets.

11. The electrochemical cell of claim 1, wherein the carbon nanosheets of the working electrode are not doped with any other material.

12. The electrochemical cell of claim 1, wherein interconnections of the carbon nanosheets of the working electrode represent points at which a first carbon nanosheet is at least partially unraveled or opened and suffers a nanosheet structural defect point, and wherein, at the defect point, carbon or graphene-like material of the carbon nanosheets branches from the first carbon nanosheet to form a second carbon nanosheet.

13. The electrochemical cell of claim 1, wherein the carbon nanosheets of the working electrode consist of carbon.

14. The electrochemical cell of claim 1, wherein the carbon nanosheets of the working electrode consist of graphene.

15. The electrochemical cell of claim 1, wherein the interconnected carbon nanosheets of the working electrode form a dendrimer structure.

\* \* \* \* \*